(12) United States Patent
Remple

(10) Patent No.: US 12,463,644 B2
(45) Date of Patent: Nov. 4, 2025

(54) DEVICE, SYSTEM AND METHOD TO PROVIDE ADAPTIVE CLOCK MODULATION WITH DELAY LINE CIRCUITS

(71) Applicant: Intel Corporation, Santa Clara, CA (US)

(72) Inventor: Terry Remple, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 639 days.

(21) Appl. No.: 17/834,669

(22) Filed: Jun. 7, 2022

(65) Prior Publication Data

US 2023/0396249 A1    Dec. 7, 2023

(51) Int. Cl.
```
H03K 5/00      (2006.01)
H03K 3/037     (2006.01)
H03K 5/14      (2014.01)
H03K 19/00     (2006.01)
H03K 19/21     (2006.01)
```

(52) U.S. Cl.
CPC ......... *H03K 19/0016* (2013.01); *H03K 3/037* (2013.01); *H03K 5/14* (2013.01); *H03K 19/21* (2013.01); *H03K 2005/00013* (2013.01)

(58) Field of Classification Search
CPC ... G06F 1/10; G06F 1/08; G06F 1/305; G06F 1/06; G06F 1/28; G06F 1/324; G06F 1/26; G06F 1/12; G06F 1/32; G06F 1/3296; H03K 5/05; H03K 5/15; H03K 5/19; H03K 5/131; H03K 5/135
See application file for complete search history.

(56) References Cited

U.S. PATENT DOCUMENTS

| | | | |
|---|---|---|---|
| 10,009,016 B1 * | 6/2018 | Ho | G06F 1/305 |
| 12,353,235 B2 * | 7/2025 | Remple | H03L 7/0992 |
| 2011/0063022 A1 * | 3/2011 | Tom | H03L 7/00 |
| | | | 327/544 |
| 2011/0068858 A1 * | 3/2011 | Chawla | G06F 1/324 |
| | | | 327/538 |
| 2019/0319609 A1 * | 10/2019 | Wong | H03K 3/012 |
| 2022/0019258 A1 | 1/2022 | Remple | |
| 2023/0396249 A1 * | 12/2023 | Remple | H03K 5/14 |
| 2024/0106423 A1 * | 3/2024 | Dimitriadis | G06F 1/28 |
| 2025/0211238 A1 * | 6/2025 | Galan | H03L 7/0816 |

* cited by examiner

*Primary Examiner* — Tuan T Lam

(74) *Attorney, Agent, or Firm* — NICHOLSON DE VOS WEBSTER & ELLIOTT LLP

(57) ABSTRACT

Techniques and mechanisms for using multiple delay line circuits to detect a change to the frequency of a periodic signal. In an embodiment, a first delay line receives the periodic signal from a phase locked loop, and generates first bits which include an indication of a first edge segment of the delay line. Another two delay lines receive respective bits which are variously based on a sampling of the first bits. The other two delay lines each output a respective one of two bit sequences, which are sampled or otherwise used to determine the transitioning of a clock signal. In another embodiment, the frequency of the clock signal is determined based on one of a threshold minimum period of time that the frequency of the periodic signal is stable, a threshold minimum frequency of the periodic signal, or a threshold minimum increase to the frequency of the periodic signal.

20 Claims, 14 Drawing Sheets

DEVICE, SYSTEM AND METHOD TO PROVIDE ADAPTIVE CLOCK MODULATION WITH DELAY LINE CIRCUITS

BACKGROUND

1. Technical Field

This disclosure generally relates to integrated circuit and more particularly, but not exclusively, to the adaptive modulation of a clock signal.

2. Background Art

Integrated circuit devices need a supply voltage to operate. During operations of such a device, a sudden change in workload can cause current consumption in the device to increase, which in turn can cause a sharp decrease in the supply voltage. Such a sharp decrease is commonly referred to as a voltage droop. A large voltage droop can change normal operating conditions of components (e.g., combinatorial logic circuitry) in the device that can lead to functional failure of the device. Numerous standard approaches have been designed to deal with voltage droops in the die voltage. However, such standard approaches have drawbacks including increasing power consumption and lowering the power and performance of the device.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
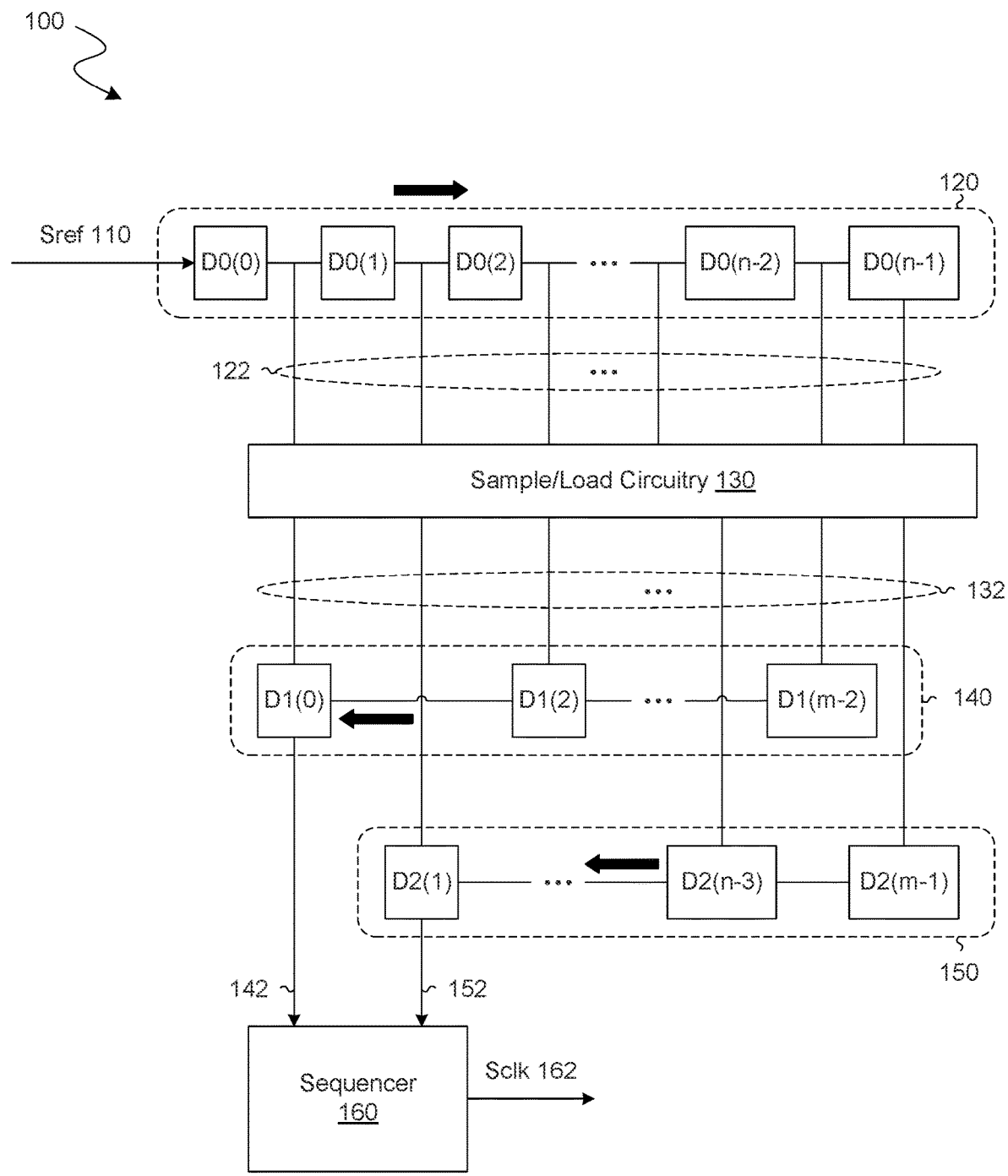
FIG. 1 shows a functional block diagram illustrating features of a device to determine a frequency of a clock signal according to an embodiment.

Embodiments discussed herein variously provide techniques and mechanisms for detecting a change to the frequency of a periodic signal using multiple delay line circuits. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry to detect for a change to the frequency of a periodic signal—e.g., as a basis for generating a clock signal.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Embodiments described herein variously facilitate adaptive clock modulation functionality based on the detection of a first edge segment of a delay line. As used herein, adaptive clock modulation, or "ACM", refers generally to the variation of the frequency of a clock signal (or of another periodic signal which is to be a basis for generating the clock signal), based on a detected state of a changing operational condition such as a level of a supply voltage.

Furthermore, as used herein, "first edge segment" refers to a given segment of a delay line, wherein—along an ordered sequence of multiple such segments in the delay line—that given segment has been identified as being the first segment to include an indication of an edge of a signal which is provided to that delay line. In various embodiments, the first edge segment of a delay line is subject to changing over time—e.g., as changes to the level of a supply voltage changes the speed at which data is propagated through the delay line.

In some embodiments, a multi-bit value is generated by sampling the segments of the delay line, wherein the multiple bits of the value each correspond to a different respective one of the segments. In one such embodiment, a current first edge segment of the delay line corresponds to one such bit (which is referred to herein as a "first edge segment bit," and/or which is in a "first edge segment bit location" of the multi-bit value).

FIG. 1 shows features of a device 100 to perform adaptive clock modulation according to an embodiment. The device 100 illustrates one example of an embodiment which comprises three delay lines, a first one of which is to receive a periodic signal such as one provided by a phase locked loop circuit. The other two delay lines are to receive respective bits which are variously based on a sampling of the first delay line, wherein bits output by the other two delay lines are to operate a sequencer which generates a clock signal. In operating the sequencer with said two other delay lines, some embodiments provide an improved responsiveness in clock modulation based on fluctuations in a supply voltage.

As shown in FIG. 1, device 100 comprises a delay line 120 which is coupled to receive a periodic signal Sref 110. In one embodiment, signal Sref 110 is provided, for example, by a phase locked loop circuit (not shown) that is coupled to—or alternatively, is a component of—device 100. Portions of delay line 120 which are coupled in series with each other (the portions referred to as "first segments") each comprise a respective one or more delay elements. At a given time, a delay element of delay line 120 holds a bit value which is received from a preceding delay element of the delay line, and/or which is to be provided to a next subsequent delay element of delay line 120.

For example, first segments of delay line 120 each comprise a different respective one of first delay elements—e.g., including the illustrative delay elements D0(0), D0(1), ..., D0(n−1) shown—which, at a given time, each provide a respective bit value based on signal Sref 110. When an edge of signal Sref 110—e.g., a rising edge or a falling edge—is received at delay line 120, delay element D0(0) transitions from outputting one bit value to outputting a different bit value. Some or all of the other delay elements D0(1), ..., D0(n−1) of delay line 120 similarly transition, successively, as the effect of the received signal edge propagates at least partially through delay line 120.

In an embodiment, sample/load circuitry 130 of device 100 is coupled to sample multiple bits 122 each from a different respective segment of delay line 120—e.g., wherein bits 122 are each received by sample/load circuitry 130 from a different respective one of delay elements D0(0), D0(1), ..., D0(n−1). Based on the bits 122, sample/load circuitry 130 generates a thermometer code value which comprises bits 132.

In an embodiment, another delay line 140 of device 100 comprises delay elements D1(0), D1(1), ..., D1(m−1) which are coupled each to receive a different respective one of second bits from bits 132, wherein the delay line 140 is to output the second bits in a bit sequence 142. Similarly, yet another delay line 150 of device 100 comprises delay elements D2(0), D2(1), ..., D2(m−1) which are coupled each to receive a different respective one of third bits from bits 132, wherein the delay line 150 is to output the third bits in a bit sequence 152.

In the example embodiment shown, device 100 includes (or alternatively, is to be coupled to) a sequencer 160 which receives two bits each from a different respective one of the bit sequence 142 or the bit sequence 152. In one such embodiment, sequencer 160 is to generate a periodic signal Sclk 162 based on each of the two bits. For example, sequencer 160 samples or otherwise identifies select bits from bit sequences 142, 152, wherein said select bits variously determine when a rising edge of signal Sclk 162 is to occur or when a falling edge of signal Sclk 162 is to occur.

Figure 2:
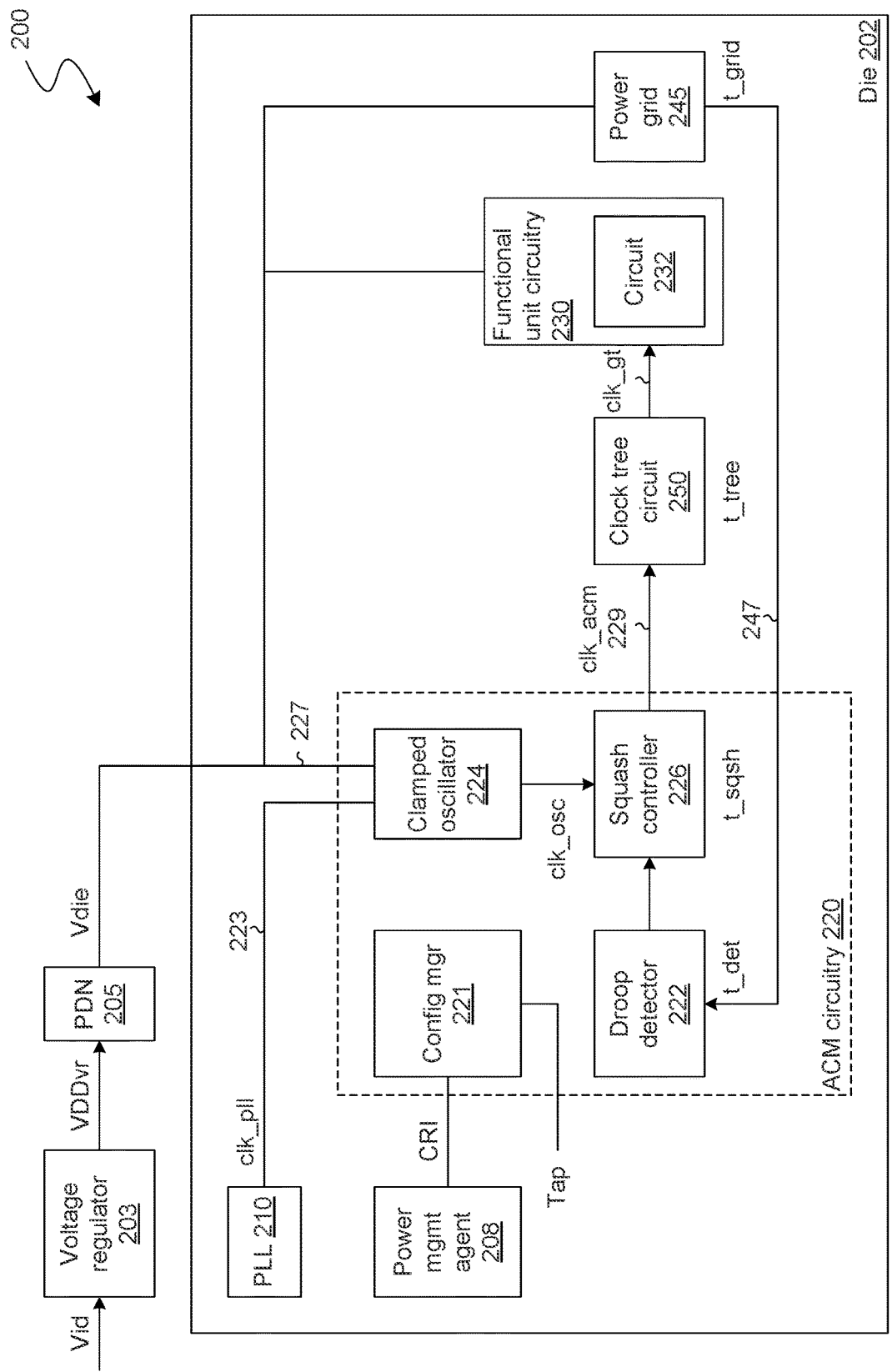
FIG. 2 shows a functional block diagram illustrating features of a system to adaptively change a clock frequency according to an embodiment.

FIG. 2 shows features of an apparatus 200 to determine a frequency of a clock signal according to an embodiment. Apparatus 200 illustrates one embodiment which provides ACM functionality to determine a clock frequency using an arrangement of delay lines and sampler-loader circuitry as variously described herein.

For example, apparatus 200 includes some or all features of device 100.

As shown in FIG. 2, apparatus 200 comprises a die 202 (e.g., a semiconductor die) comprising adaptive clock modulation (ACM) circuitry 220, according to some embodiments described herein. For example, die 202 includes an integrated circuit (IC) chip, a system-on-chip (SoC), or part of an SoC. As an example, die 202 is part of a central processing unit (CPU) package, a graphics processing unit (GPU), or other types of circuitries.

As shown in FIG. 2, apparatus 200 comprises a voltage regulator 203 to generate a voltage (e.g., a regulated voltage) VDDvr based on a reference voltage Vid. Apparatus 200 comprises a power delivery network (PDN) 205 to deliver a voltage (e.g., die voltage) Vdie to die 202. Die 202 uses Vdie as a rail voltage for its operations. In this description, voltages Vdie and Vid are also called Vdie and Vid (without the word "voltage") for simplicity. Similarly, voltages $V_{NOM}$ and $V_{AGR}$ (described below) are also called $V_{NOM}$ and $V_{AGR}$, respectively, for simplicity.

In an embodiment, apparatus 200 includes or is included in a system (e.g., a computer) where die 202 and voltage regulator 203 is located on a circuit board (e.g., a motherboard, not shown) of the system. In some embodiments, die 202 includes or is part of an IC package (not shown) that is connected to voltage regulator 203 through PDN 205. In an example, PDN 205 comprises conductive paths (not shown) between die 202 and voltage regulator 203. The conductive path comprises conductive elements, such as solder bumps (e.g., micro-bumps) between die 202 and the package substrate, vias and connections in the package substrate, solder balls between the package substrate and the circuit board, and conductive connections (e.g., copper traces) on the circuit board coupled between the package substrate and voltage regulator 203. In various embodiments, PDN 205 also includes capacitors on the circuit board and other voltage regulators connected to the connections in the package substrate.

As shown in FIG. 2, die 202 includes and/or is coupled via a node (e.g., supply node) 227 to receive Vdie—e.g., wherein node 227 is part of a supply rail of die 202. Die 202 comprises—or alternatively, is coupled to—a phase lock loop (PLL) 210 that generates a periodic signal (e.g., PLL output signal) clk_pll. ACM circuitry 220 of die 202 comprises a node (e.g., input clock node) 223 to receive the periodic signal clk_pll, and a node (e.g., output clock node) 229 to generate a clock signal clk_acm based on periodic signal clk_pll. ACM circuitry 220 also generates another clock signal clk_osc based on periodic signal clk_pll. Clock signal clk_acm from ACM circuitry 220 is distributed to other components of die 202.

Die 202 comprises functional unit circuitry 230, which comprises a circuit 232. For example, functional unit circuitry 230 includes or is part of a processor (e.g., a processing core). In various embodiments, functional unit circuitry 230 comprises other circuits (e.g., circuits in a CPU or a GPU) that are omitted from FIG. 2 for simplicity. Circuit 232 of functional unit circuitry 230 comprises a node (e.g., supply node, not labeled) coupled to node 227 to receive Vdie. Die 202 includes a power grid 245 that, for example, is part of—or is otherwise to operate with—the PDN 205.

Die 202 comprises a global clock tree circuit 250 that receives a clock signal clk_acm from ACM circuitry 220 provide clock signal clk_acm to functional unit circuitry 230 as clock signal clk_gt. Functional unit circuitry 230 uses clock signal clk_gt for its operations. The frequency of clock signal clk_gt is based on the frequency of clock signal clk_acm. For example, the frequency of clock signal clk_gt is the same as (equal to) the frequency of clock signal clk_acm. By way of illustration and not limitation, the frequency of clock signal clk_gt is in the gigahertz (GHz) range (e.g., 2 GHz or higher), in some embodiments.

ACM circuitry 220 operates to mitigate the effects of voltage droops (e.g., including some or all of first, second, and third voltage droops) of Vdie, so that die 202 operates at a relatively lower voltage in comparison with some similar devices. The lower voltage results in less power consumption and an improvement in the Power and Performance (PnP) metric.

As shown in FIG. 2, ACM circuitry 220 comprises a configuration manager 221 to control operation of ACM circuitry 220, a droop detector 222, a clamped oscillator 224, and a squash controller 226. ACM circuitry 220 and its components (e.g., clamped oscillator 224, and squash controller 226) are located between on clock path between PLL 210 and global clock tree circuit 250 to distribute a clock signal (e.g., clock signal clk_acm) to global clock tree circuit 250. In one such embodiment, clamped oscillator 224 provides functionality of device 100—e.g., wherein periodic signal clk_pll and clock signal clk_osc correspond functionally to signal Sref 110 and signal Sclk 162 (respectively).

Configuration manager 221 comprises components that include firmware, hardware, or software or any combination of firmware, hardware, and software to perform, for example, calibration, configuration and/or monitoring of droop detector 222, clamped oscillator 224, and squash controller 226. For example, configuration manager 221 comprises a state machine (e.g., finite state machine), register circuits, read-only-memory (ROM), and/or any of various other components that suitable to perform such operations calibration, configuration and/or monitoring. As shown in FIG. 2, die 202 and include a test access port (TAP) for debugging of ACM circuitry 220, and control register interface (CRI) to access information (e.g., run time information) stored in a memory power management agent 208 during normal operation of die 202.

Droop detector 222 operates to detect a voltage droop of Vdie based on information from a connection 247, which is part of a feedback loop of ACM circuitry 220. Droop detector 222 generates droop information to indicate that voltage droop has occurred. By way of illustration and not limitation, such droop information also includes information regarding the relationships between voltages Vdie, $V_{NOM}$, and $V_{AGR}$ at a particular time. $V_{NOM}$ and $V_{AGR}$ and voltages corresponding to a nominal threshold and an aggressive threshold, respectively. In FIG. 2, based on the droop information, ACM circuitry 220 performs ACM operations to mitigate a voltage droop as described herein.

In the example embodiment shown, clamped oscillator 224 comprises a node (e.g., input clock node) coupled to node 223 to receive clock signal clk_pll and generate clock signal clk_osc based on clock signal clk_pll. For example, clamped oscillator 224 selectively performs a stretching or clamping of a frequency of clock signal clk_osc in response to changes in Vdie. At a given time, the frequency of clock signal clk_osc is higher than, lower than, or equal to that of clk_pll. In an illustrative scenario according to one embodiment, clamped oscillator 224 performs a clock stretching operation to stretch the period of clock signal clk_osc when Vdie slews down.

In various embodiments, clamped oscillator 224 is configured to perform a frequency clamping operation to clamp the frequency of clock signal clk_osc (called $f_{clk\_osc}$ for simplicity) to a selected frequency (e.g., predefined frequency). For example, one such selected frequency is the frequency of clock signal clk_pll (called $f_{clk\_pll}$ for simplicity). For example, $f_{clk\_osc}$ is clamped below (or not to exceed) $f_{clk\_pll}$. Clamping $f_{clk\_osc}$ avoids violation when the die voltage slews up (rises). In some embodiments, clamped oscillator 224 operates to clamp $f_{clk\_osc}$ to a portion of clock signal clk_pll when the die voltage Vdie slews up.

Squash controller 226 in FIG. 2 receives clock signal clk_osc and generate clock signal clk_acm based on clock signal clk_osc. For example, squash controller 226 performs a clock squashing operation to squash clock signal clk_osc, such that a different number (quantity) of cycles of clock signal clk_osc is squashed (e.g., removed) as a result of the clock squashing operation. In an embodiment, squash controller 226 is configured to modify a squash density with one response function to squash clock signal clk_osc when Vdie crosses $V_{NOM}$, and modify the squash density with another response function to squash clock signal clk_osc when Vdie crosses $V_{AGR}$.

In some embodiments, squash controller 226 further comprises (or is coupled to operate with) circuitry to correct a duty cycle of clock signal clk_acm. For example, such circuitry operates such that clock signal clk_acm has a 50% duty cycle.

During an operation of ACM circuitry 220, clamped oscillator 224, and squash controller 226 operate such that the frequency of a clock signal clk_gt, which is output by clock tree circuit 250, is adjusted based on operating conditions of functional unit circuitry 230 and circuit 232 and the condition (e.g., the value) of voltage Vdie. For example, when a voltage droop occurs, clamped oscillator 224 and squash controller 226 operate to adjust the frequency of clock signal clk_acm, which in turn adjusts the frequency of clock signal clk_gt to mitigate the voltage droop.

Figure 3A:
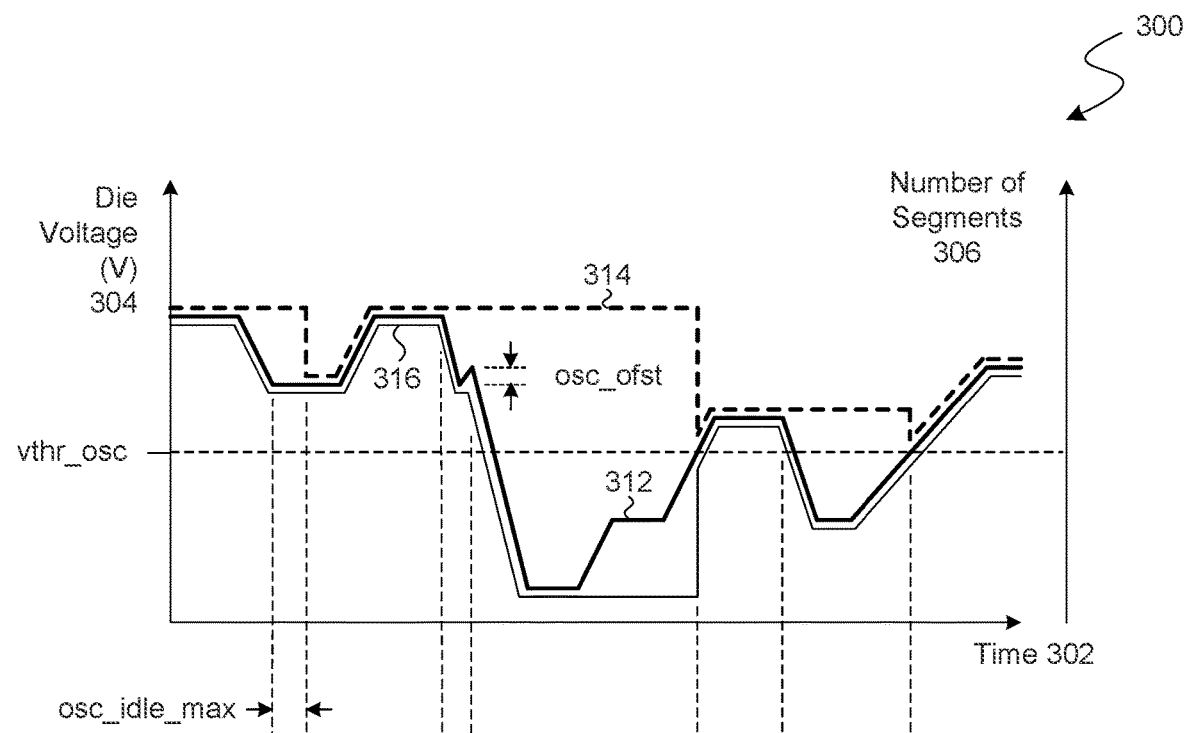
FIGS. 3A, 3B show graphs each illustrating respective features of a circuit to adaptively change a frequency of a clock signal according to an embodiment.
Figure 3B:
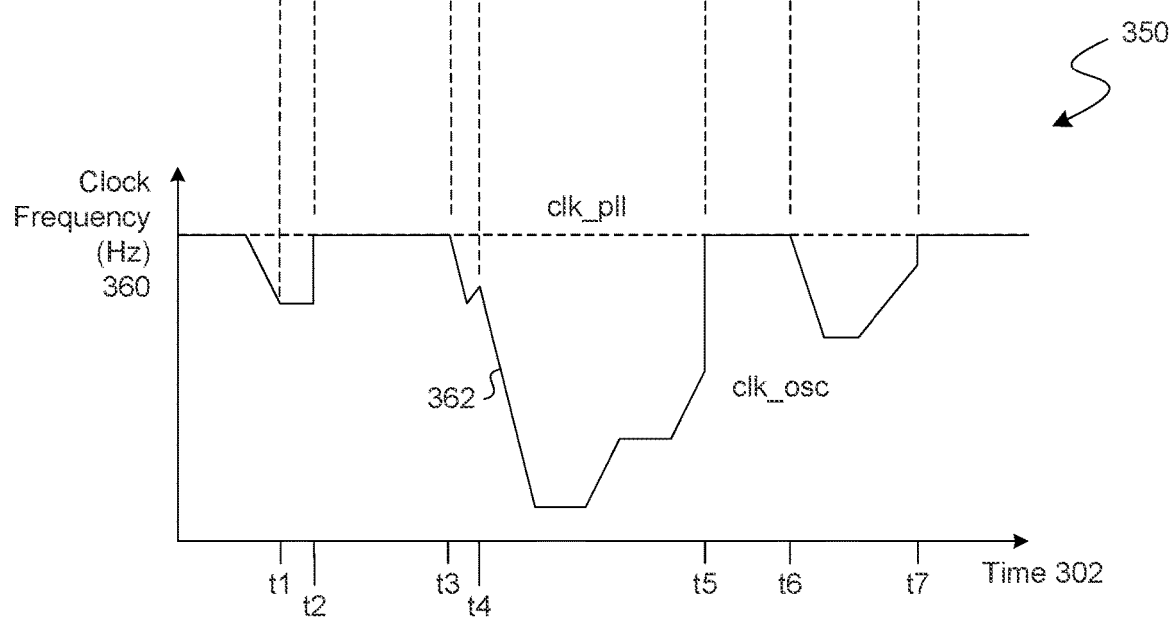

FIGS. 3A, 3B show respective graphs 300, 350 each illustrating features of adaptive clock modulation which is provided according to an embodiment. Clock modulation such as that represented in graphs 300, 350 is provided by device 100 or ACM circuitry 220, for example.

As shown in FIG. 3A, graph 300 comprises various plots 312, 314, 316 which variously extend in a range 304 of voltage levels for a die voltage, and over a period of time 302. For one or more voltage levels in range 304, each such level corresponds to a respective number in another range 306 of possible numbers of segments in a delay line (such as delay line 120). For example, for a given voltage level in range 304, the corresponding number in range 306 indicates which segment in the delay line is a first edge segment due, in part, to the delay line receiving a periodic signal clk_pll while being powered while the die voltage is at that given voltage level). Accordingly, for a given time in the period of time 302, plot 312 represents the current die voltage (and the segment number of the current first edge segment in the delay line). Plots 314, 316 correspond to a lower frequency metric and an upper frequency metric, respectively, which are used in some embodiments to determine, at least in part, whether a frequency of a clock signal clk_osc is to be equal to the frequency of a PLL output signal clk_pll. For example, plots 314 indicate respective segment numbers which correspond to the lower frequency metric and an upper frequency metric. Graph 350 comprises a plot 362 of the frequency 360 of the clock signal clk_osc.

As illustrated in graphs 300, 350, some embodiments provide ACM functionality to detect a first condition wherein a frequency of signal clk_pll has been stable throughout a threshold period of time (osc_idle_max) after a decrease of the frequency of signal clk_pll—e.g., wherein the frequency decreases to a level which is above a threshold minimum frequency level (which corresponds to the threshold die voltage level vthr_osc). In an illustrative scenario according to some embodiments, such a first condition is satisfied at the time t2 shown—i.e., after the first edge segment has been both stable, and above a number which corresponds to the threshold die voltage level vthr_osc, since time t1. Based on such a detection of the first condition, ACM circuitry 220 (and/or other suitable circuitry) sets the frequency of the signal clk_osc to be equal to the frequency of signal clk_pll. In response to the frequency of signal clk_osc being set to that of signal clk_pll, the upper frequency metric indicated by plot 314 is set to a level corresponding to the current value of plot 312.

Additionally or alternatively, some embodiments provide ACM functionality to detect a second condition wherein, after a decrease of the frequency of signal clk_pll to a most recent local minimum frequency level, the frequency of signal clk_pll has increased, by at least a threshold minimum frequency difference, from the most recent local minimum frequency level to a level which is above a threshold minimum frequency level. In an illustrative embodiment shown, such a second condition is satisfied at the time t5—i.e., after the first edge segment has increased by more than a threshold minimum number (indicated by osc_ofst) to above the number in range 306 which corresponds to the threshold die voltage level vthr_osc. It is to be noted, for example, that the second condition is not satisfied at time t4, since the increase in plot 312 from a most recent local minimum is less than the threshold amount indicated by osc_ofst. In response to the frequency of signal clk_osc being set to that of signal clk_pll, the lower frequency metric indicated by plot 316 is set to a level corresponding to the current value of plot 312.

Figure 4:
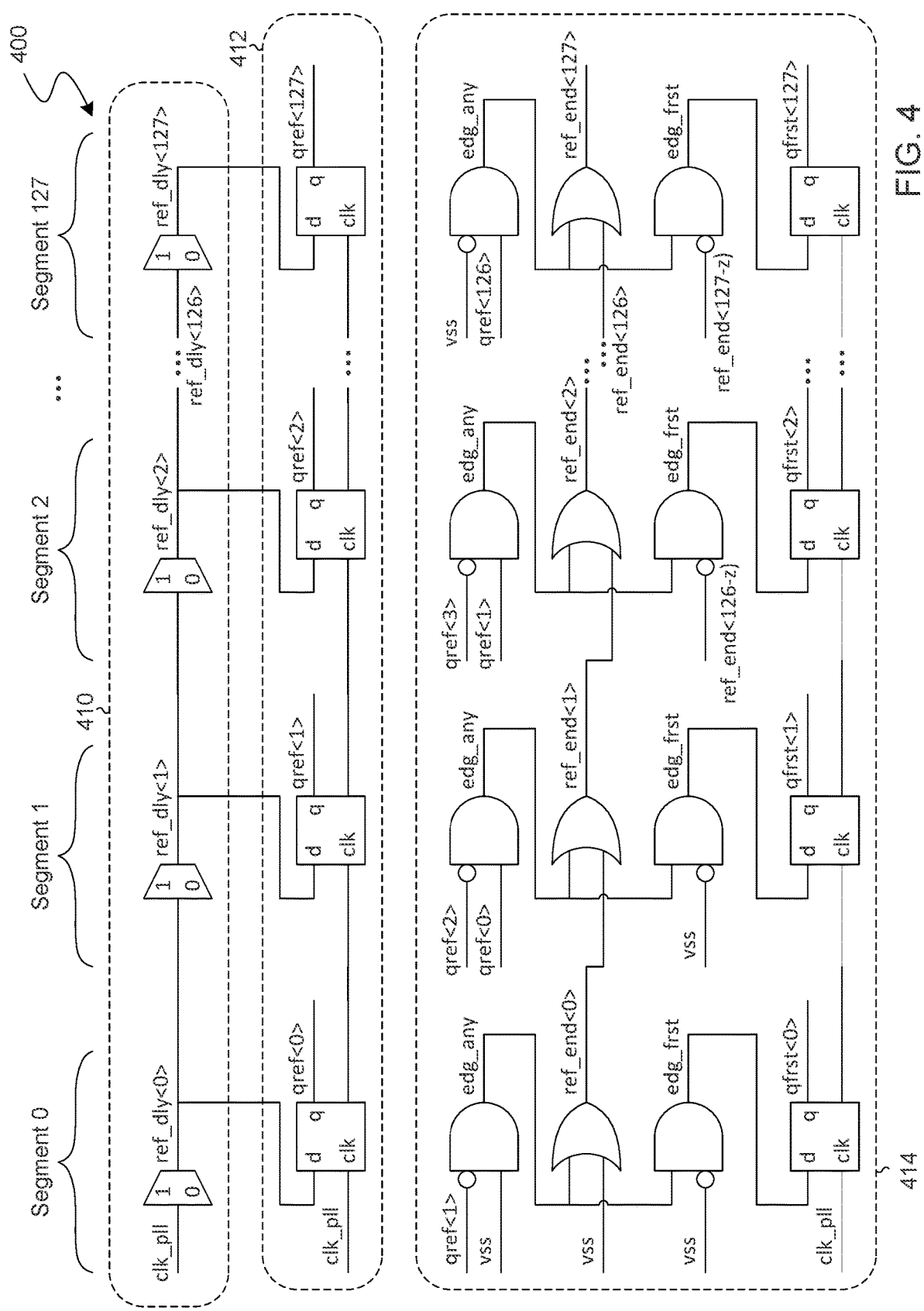
FIG. 4 shows a circuit diagram illustrating features of a reference period detector according to an embodiment.

FIG. 4 shows features of a frequency detector 400 to detect the period (and similarly, a corresponding frequency) of a signal, to facilitate ACM functionality according to an embodiment. In various embodiments, frequency detector 400 provides at least some functionality of clamped oscillator 224—e.g., wherein frequency detector 400 implements features of delay line 120 and sample/load circuitry 130, for example. To illustrate certain features of various embodiments, ACM functionality is described herein with reference to delay lines which each comprise a respective 128 segments (each of which comprise a respective one or more delay elements). However, such description can be extended to similarly apply to a delay line comprising more (or fewer) segments, and different embodiments are not limited with respect to a particular number of the multiple segments in a delay line.

As shown in FIG. 4, frequency detector 400 comprises a delay line 410 which is coupled to receive a periodic signal clk_pll, and sampler circuit 412 which is coupled to sample multiple bits each from a different respective segment of delay line 410. In the illustrative embodiment shown, delay line 410 comprises an in-series arrangement of 128 segments, each of which comprises a respective two-to-one multiplexer which is to function as a delay element. At a given time, a rate at which data propagates along delay line 410 depends in part on a varying level of a die voltage which powers the delay elements. Some embodiments sample bits in delay line 410 as a basis for evaluating said propagation rate (and, for example, one or more characteristics of the die voltage).

For example, in an illustrative scenario according to one embodiment, an edge of the signal clk_pll (e.g., a low-to-high rising edge) is launched down delay line 410. After a next subsequent single cycle of signal clk_pll, qref flip-flops of sampler circuit 412 sample bits ref_dly<127:0> which indicate how far an indication of this most recent rising edge of signal clk_pll has propagated in delay line 410. In a situation wherein a die voltage (which powers the two-to-one multiplexers of delay line 410) is relatively high, the propagation delay through delay line 410 is relatively short, and the indication of a rising (or other) signal edge propagates through relatively more segments of delay line 410. By contrast, in another situation wherein the die voltage is relatively low, an indication of the rising (or other) signal edge propagates through relatively fewer segments of delay line 410. Based on the sampling of delay line 410, the qref flip-flops of sampler circuit 412 output 128 bits qref<127:0> which are based on signal clk_pll.

Frequency detector 400 further comprises edge detection circuit 414 to generate second bits based on the 128 bits qref<127:0> from sampler circuit 412. By way of illustration and not limitation, OR gates of edge detection circuit 414 generate bits ref_end<127:0> of a thermometer code value, wherein said bits each correspond to a different respective segment of delay line 410. In one such embodiment, a most significant set bit of the thermometer code value corresponds to a current first edge segment of delay line 410—e.g., wherein any less significant bits of the thermometer code value have a value of one, any more significant bits of the thermometer code value have a value of zero.

Based on the bits ref_end<127:0> of the thermometer code value, edge detection circuit 414 further generates edg_frst signals, which are then captured with qfrst flip-flops, and provided as bits qfrst<127:0> of a one-hot code indicating which segment of delay line 410 is the current first edge segment. In one illustrative embodiment, the current first edge segment corresponds to a sole set bit (e.g., set to one) of the one-hot code, wherein all other bits of qfrst<127:0> have a value of zero.

Figure 5:
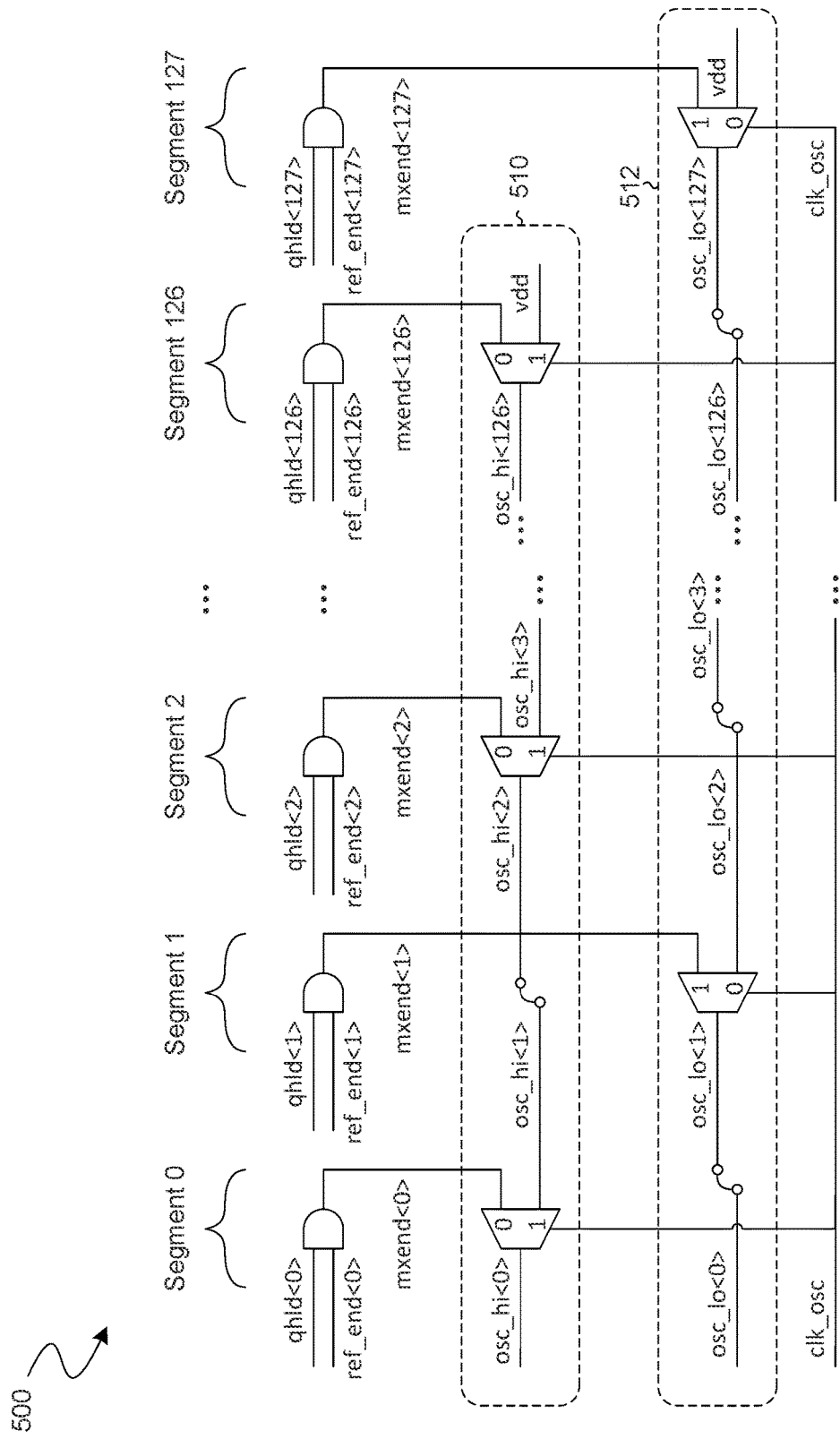
FIG. 5 shows a circuit diagram illustrating features of a clock period generator according to an embodiment.

FIG. 5 shows features of a period generator 500 which generates two sequences of bits, with respective delay lines, to facilitate ACM functionality according to an embodiment. In various embodiments, period generator 500 operates with frequency detector 400—e.g., wherein period generator 500 provides functionality such as that of delay line 140 and delay line 150.

As shown in FIG. 5, period generator 500 receives—e.g., from frequency detector 400—the bits ref_end<127:0> of a thermometer code value which indicates a most recently detected first edge segment of a delay line (such as delay line 410). Based on the bits ref_end<127:0>, period generator 500 outputs bit sequences of bits, which are to be subsequently used for determining a high time and a low time of a clock signal clk_osc.

In the example embodiment shown, AND gates of period generator 500 are used to generate bits mxend<127:0> based on the bits ref_end<127:0>, and also based on other bits qhld<127:0> which (as described herein) are indicative of whether a frequency of the clock signal clk_osc is to be equal to the frequency of the periodic signal clk_pll. Delay lines 510, 512 of period generator 500 are coupled to variously receive different respective ones of the bits mxend<127:0>, wherein each of delay lines 510, 512 is to output received ones of the bits mxend<127:0> in a respective sequence. In one such embodiment, the bits mxend<127:0> are those of another thermometer code that (for example) has at least as many initial zeros as the ref_end<127:0> code.

In an illustrative scenario according to one embodiment, when the level of clock signal clk_osc is low (during a half-cycle of clock signal clk_osc), "odd" ones of the bits mxend<127:0> are loaded each into a different respective delay element—e.g., a respective two-to-one "osc_hi" multiplexer—of delay line 510. By contrast, when the level of clock signal clk_osc is high (during a next half-cycle of clock signal clk_osc), "even" ones of the bits mxend<127:0> are loaded each into a different respective delay element—e.g., a respective two-to-one "osc_lo" multiplexer—of delay line 512.

Furthermore, when clk_osc is high, delay line 510 outputs a sequence of bits osc_hi<127:0>, whereas delay line 512 outputs another sequence of bits osc_lo<127:0> when clk_osc is low. As described elsewhere herein, these bit sequences from delay lines 510, 512 are used, for example, by a sequencer (not shown) which determines the timing of one or more edges of clock signal clk_osc. In various embodiments, a total number of delay elements of delay line 510 and/or a total number of delay elements of delay line 512 is less than (e.g., is half of) a total number of delay elements of delay line 410. In distributing the bits mxend<127:0> across multiple delay lines 510, 512, some embodiments more quickly indicate to a sequencer where a clock signal edge is to be provided according to the ACM scheme being implemented.

Figure 6:
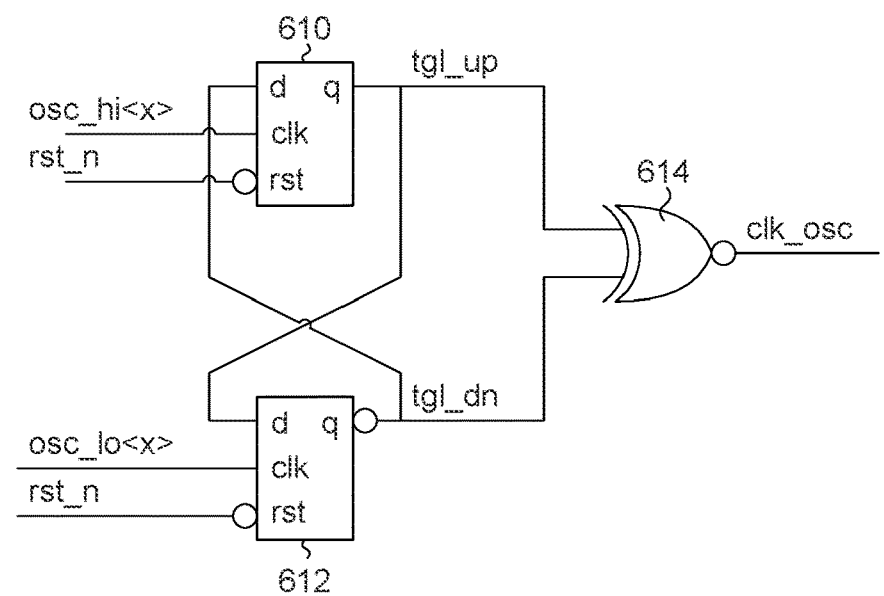
FIG. 6 shows a circuit diagram illustrating features of a sequencer to generate a clock signal according to an embodiment.

FIG. 6 shows features of a sequencer 600 to generate a clock signal based on bit sequences from respective delay lines according to an embodiment. In various embodiments, sequencer 600 provides functionality such as that of sequencer 160—e.g., wherein sequencer 600 operates with frequency detector 400 and period generator 500.

As shown in FIG. 6, sequencer 600 comprises a flip-flop 610 which is to receive a bit osc_hi<x> which is sampled from, or otherwise detected in, a first bit sequence such as that which is output by delay line 510. Another flip-flop 612 of sequencer 600 is cross-coupled with the flip-flop 610, wherein flip-flop 612 is coupled to receive a bit osc_lo<y> which is sampled from or otherwise detected in a second bit sequence such as that which is output by delay line 512. In one such embodiment flip-flop 610 is clocked only by the respective xth bits of each successively evaluated set of bits osc_hi<127:0>—e.g., wherein flip-flop 612 is clocked only by the respective yth bits of each successively evaluated set of bits osc_lo<127:0>. A reset signal rst_n facilitates a resetting of sequencer 600 to an initialization state.

The indices x, y referred to in "osc_hi<x>" and "osc_lo<y>" each indicate a respective level of bit significance and/or a correspondence to a respective segment of a delay line such as delay line 410. In some embodiments x is equal to y, for example. Additionally or alternatively, one or each of indices x and y is greater than zero (0)—e.g., wherein said index is predetermined to be sufficiently high to account for one or more circuit delays (such as a delay in communicating the bits to the sequencer, a delay in propagating a clock signal clk_osc through a clock tree, and/or the like).

In an embodiment, sequencer 600 further comprises an exclusive OR (XOR) gate 614 which is coupled to receive, from flip-flops 610, 612, respective output signals tgl_up, tgl_dn which are based on bits osc_hi<x>, osc_lo<x>. The output signals tgl_up, tgl_dn variously determine a frequency of a clock signal clk_osc which is output by XOR gate 614—e.g., wherein one or more high-to-low transitions and/or one or more low-to-high transitions of clk_osc are each in response to a respective one of output signals tgl_up, tgl_dn.

Figure 7:
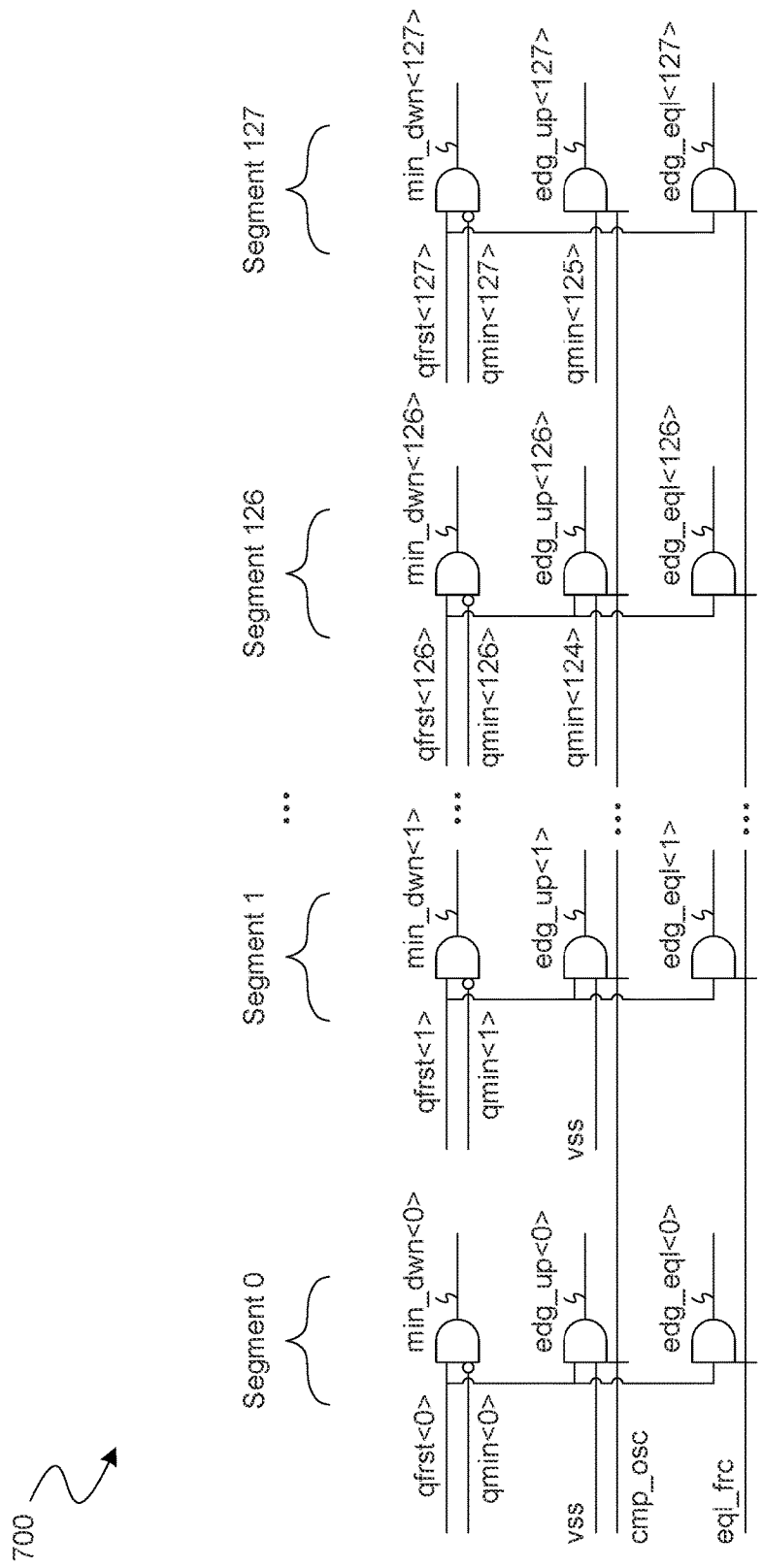
FIG. 7 shows a circuit diagram illustrating features of a frequency movement detector according to an embodiment.

FIG. 7 shows features of a frequency movement detector 700 to facilitate an adaptive clock modulation according to an embodiment. Frequency movement detector 700 illustrates one example of an embodiment which detects one or more characteristics regarding a change (if any) to the frequency of a periodic signal clk_pll. Based on the one or more characteristics, information is generated which facilitates a determining as to whether (and if so, how) a frequency of a clock signal clk_osc is to change. In various embodiments, frequency movement detector 700 operates with frequency detector 400, period generator 500, and sequencer 600, for example.

As shown in FIG. 7, frequency movement detector 700 comprises first AND gates which are each to generate a respective one of bits min_dwn<127:0> that indicate whether a code qmin<127:0> (generated, for example, by the lower frequency tracker 800 described herein) is greater than the thermometer code qfrst<127:0> which is received, for example, from frequency detector 400. In one such embodiment, bits min_dwn<127:0> help facilitate the tracking of a recent local minimum of qfrst<127:0>—e.g., where the tracking is according to one or more criteria such as represented by plot 316 in graph 300. For example, bits min_dwn<127:0> are subsequently used, if needed, to decrease a value of bits min_dwn<127:0> to be equal to, or otherwise adjusted based on, the value of thermometer code qfrst<127:0>.

Furthermore, second AND gates of frequency movement detector 700 variously generate bits edg_up<127:0> which indicate whether the first edge segment has increased (i.e., shifted to a later segment along the delay chain) by at least some threshold minimum number of segments from a recent minimum. In the example embodiment shown, bits edg_up<127:0> indicate whether the first edge segment has increased by at least two segments of the delay line (e.g., wherein the threshold minimum number of segments corresponds to the threshold voltage difference osc_ofst shown in graph 300). However, bits edg_up<127:0> are determined based on a different minimum number of segments, in other embodiments. In the example embodiment shown, generation of bits edg_up<127:0> is further based on a control signal cmp_osc which is asserted when the first edge segment is currently equal to or greater than a segment which corresponds to a threshold minimum die voltage (such as the threshold voltage level vthr_osc shown in graph 300).

Further still, third AND gates of frequency movement detector 700 variously generate bits edg_eql<127:0> which indicate whether the first edge segment has been constant for at least some predetermined threshold minimum period of time (such as the threshold period of time osc_idle_max shown in graph 300). For example, these third AND gates receive a control signal eql_frc which is asserted if thermometer code qfrst<127:0> (or some other value which similarly indicates a first edge segment bit location) has remain the same for a sufficiently long duration. In one illustrative embodiment, the threshold period of time osc_idle_max is in a range of 5 nanoseconds (ns) to 10 ns.

Figure 8:
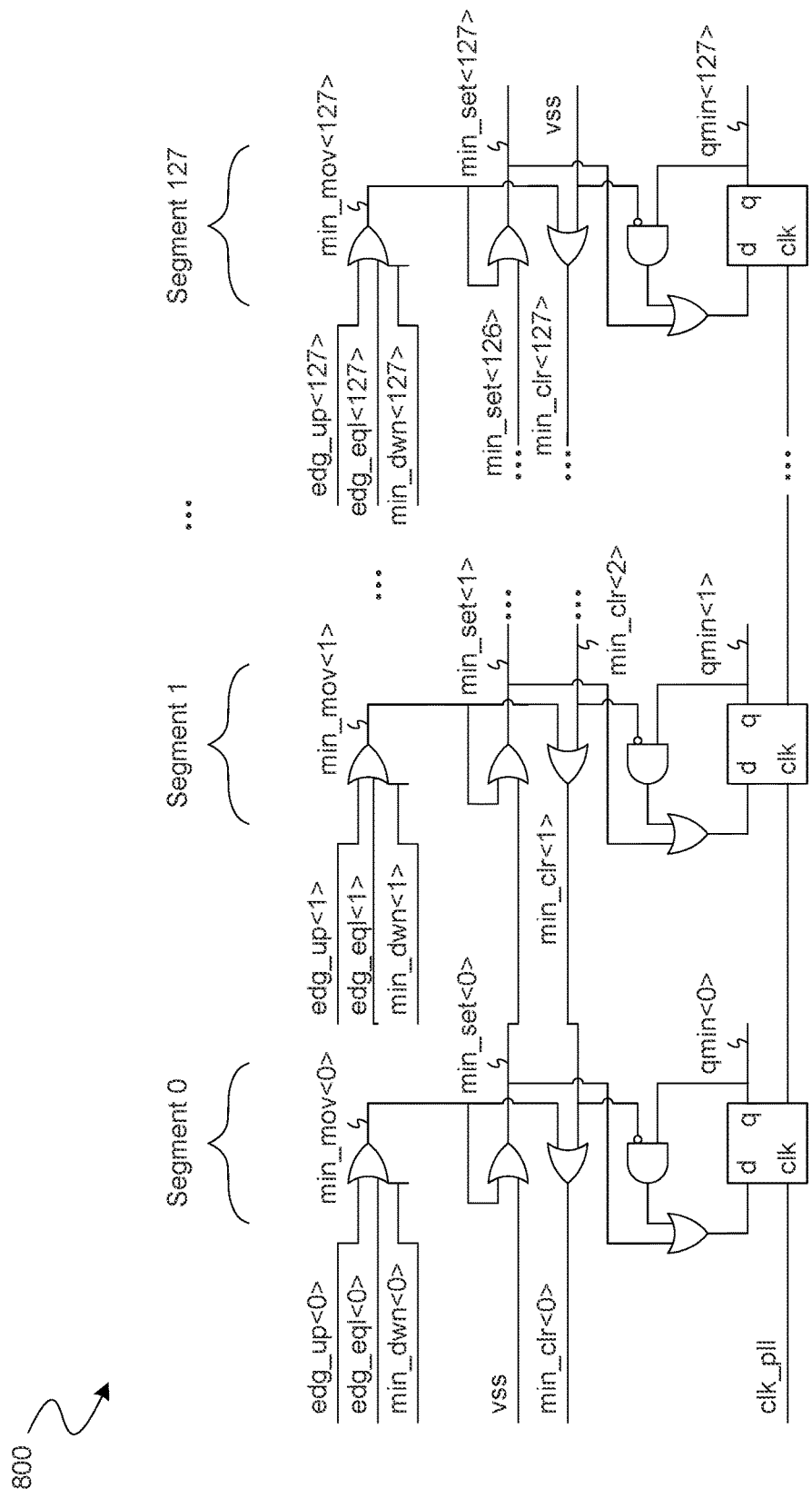
FIG. 8 shows a circuit diagram illustrating features of a lower frequency tracker according to an embodiment.

FIG. 8 shows features of a lower frequency tracker 800 to generate information, which indicates a recent minimum of a first edge segment, to facilitate ACM functionality according to an embodiment. In various embodiments, lower frequency tracker 800 operates with frequency detector 400, period generator 500, sequencer 600, and frequency movement detector 700 to facilitate generation of a clock signal clk_osc.

As shown in FIG. 8, lower frequency tracker 800 responds to the respective values of edg_up<127:0>, edg_eql<127:0> and min_dwn<127:0>—which are variously generated by frequency movement detector 700—by selectively asserting respective ones of the bits min_mov<127:0> shown. In one such embodiment, this causes those ones of bits min_set<127:0> which are above a first edge segment bit location to be set, which in turn (in combination with the bits min_clr<127:0> shown) cause the qmin<127:0> flops above the first edge segment bit location to be set.

Figure 9:
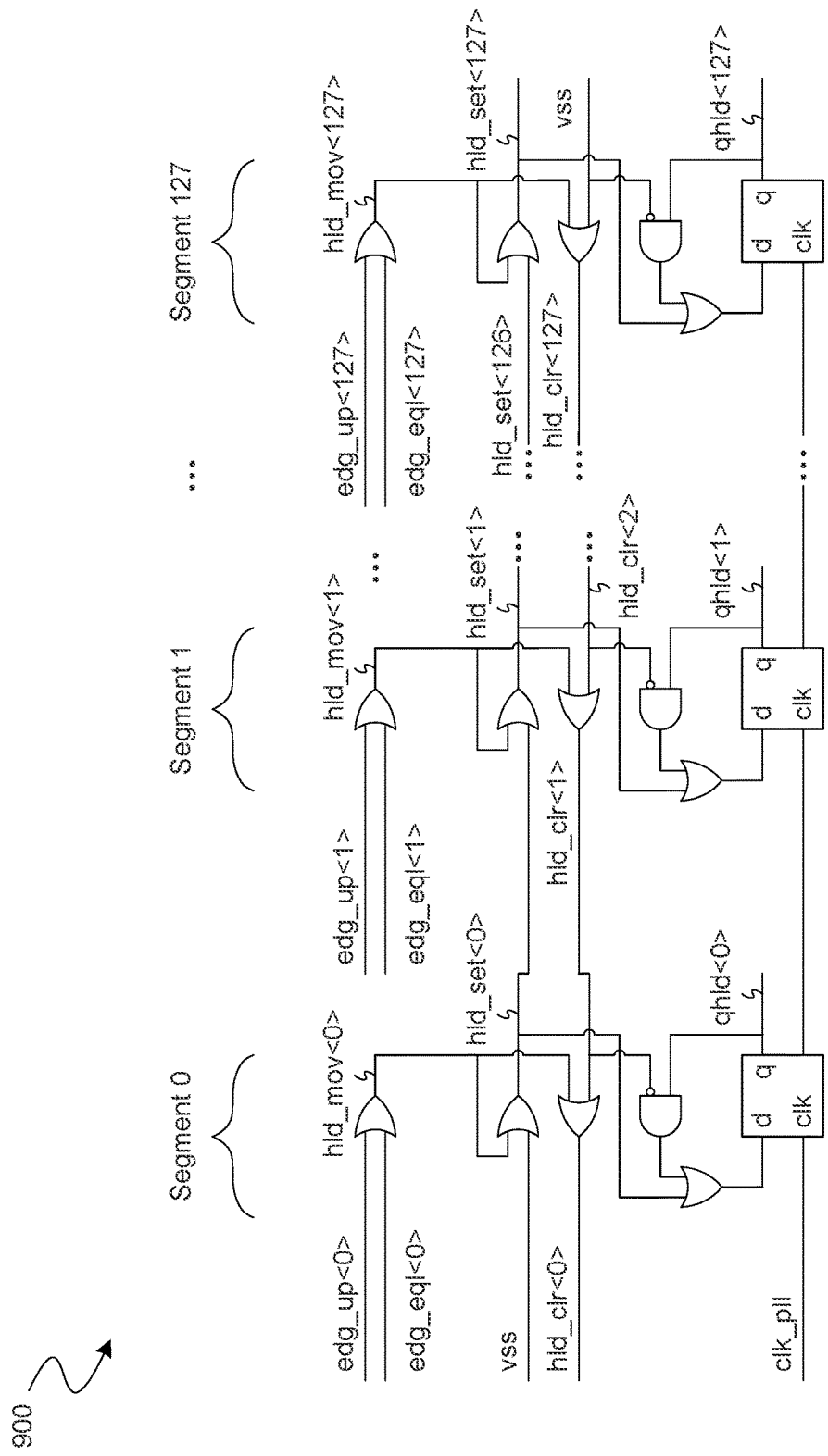
FIG. 9 shows a circuit diagram illustrating features of an upper frequency tracker according to an embodiment.

FIG. 9 shows features of an upper frequency tracker 900 to generate information which indicates a tracked number of delay line segments (and a corresponding tracked "hold" frequency) for use in providing ACM functionality according to an embodiment. For example, such information provides a basis for determining whether a frequency of a clock signal clk_osc is to be equal to a frequency of a periodic signal clk_pll. In various embodiments, upper frequency tracker 900 operates in combination with frequency detector 400, period generator 500, sequencer 600, frequency movement detector 700, and lower frequency tracker 800 to facilitate generation of a clock signal clk_osc.

As shown in FIG. 9, upper frequency tracker 900 responds to the respective values of edg_up<127:0>, and edg_eql<127:0>—generated by frequency movement detector 700—by selectively asserting respective ones of the bits hld_mov<127:0> shown. In one such embodiment, this causes those ones of bits hld_set<127:0> which are above a first edge segment bit location to be set, which in turn (in combination with the bits hld_clr<127:0> shown) cause the qhld<127:0> flops above the first edge segment bit location to be set.

Figure 10:
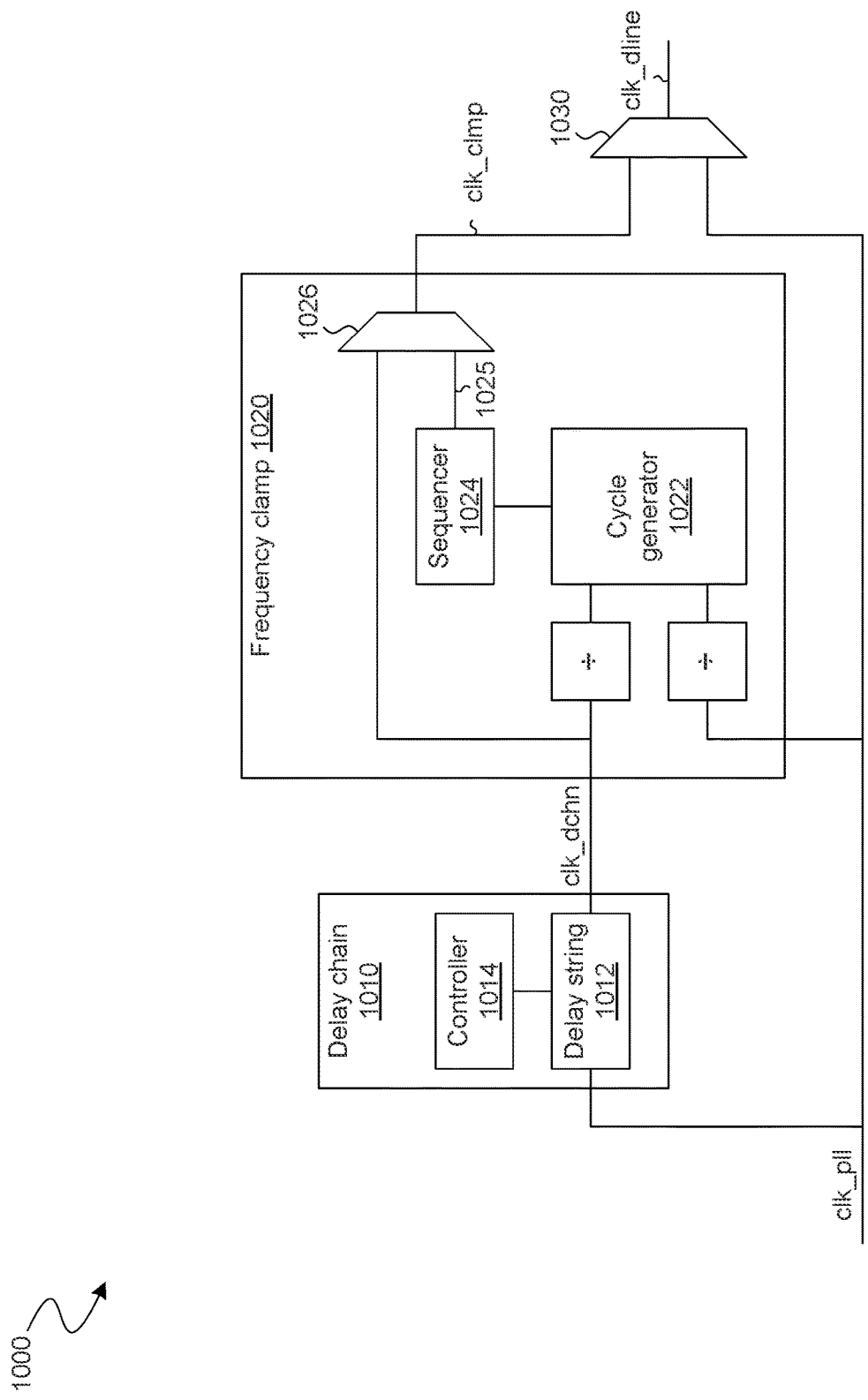
FIG. 10 shows a functional block diagram illustrating features of a system to adaptively change a clock frequency according to an embodiment.

FIG. 10 shows features of delay line circuitry 1000 which is to facilitate adaptive clock modulation according to another embodiment. Delay line circuitry 1000 illustrates one example of an embodiment wherein delay lines are used to detect the respective frequencies of two periodic signals, and wherein—based on such detection—two other delay lines generate information to determine transitions of a clock signal. In various embodiments, delay line circuitry 1000 is implemented by a device having features of die 202—e.g., wherein a delay chain 1010 and a frequency clamp 1020 of delay line circuitry 1000 are provided in lieu of clamped oscillator 224.

As shown in FIG. 10, a periodic signal clk_pll—e.g., from a PLL circuit (not shown)—is provided to a frequency clamp 1020 comprising a delay string 1012. In an embodiment, delay string 1012 includes an in-series arrangement of inverters and/or other suitable circuit components which are configured, by a controller 1014 of delay chain 1010, to generate a frequency modulated version of signal clk_pll (represented as delay chain output signal clk_dchn). In various embodiments, circuitry of delay string 1012 is adapted from any of various existing delay string designs, which are not described herein to avoid obscuring features of said embodiments.

In various embodiments, circuitry of delay line circuitry 1000 is powered with a voltage Vdd. When the voltage Vdd slews down, the effect on delay chain 1010 causes periods of signal clk_dchn to increase, which (for example) results in signal clk_dchn having a frequency which is less than that of periodic signal clk_pll. By contrast, when Vdd slews up, a frequency of signal clk_dchn becomes greater than that of periodic signal clk_pll In one such embodiment, frequency clamp 1020 receives both of signals clk_pll and clk_dchn, and generates a clamped clock signal clk_clmp which (for example) is based on whichever one of signals clk_pll and clk_dchn currently has a lower frequency. For example, signal clk_dchn is used (when it has a relatively low frequency) to mitigate the risk of setup violations during a first droop event wherein voltage Vdd slews down. However, when voltage Vdd slews up, the relatively high frequency signal clk_dchn (if it were passed on to the load circuitry) would be more likely to contribute to such setup violations.

Accordingly, in some embodiments, when its frequency is low (e.g., lower than that of periodic signal clk_pll) signal clk_dchn is passed as the output signal clk_cmpl, from frequency clamp 1020 to load circuitry such as that of a graphics core. In one such embodiment, frequency clamp 1020 instead passes signal clk_pll (or another periodic signal which is generated based on signal clk_pll) to such load circuitry when a frequency of clk_dchn is relatively high.

In the illustrative embodiment shown, frequency clamp 1020 comprises a cycle generator 1022 and a sequencer 1024 to generate a clock signal 1025 based on signals clk_pll and clk_dchn. In various embodiments, cycle generator 1022 comprises a first delay chain to receive signal clk_pll (or, in this example, a frequency divided version thereof), and a first sampler circuit which samples first bits from the first delay chain. Based on the sampled first bits, the first sampler circuit generates second bits which indicate a respective first edge segment of the first delay line.

In one such embodiment, cycle generator 1022 further comprises a second delay chain to receive signal clk_dchn (or, in this example, a frequency divided version thereof), and a second sampler circuit which samples second bits from the second delay line. Based on the sampled second bits, the second sampler circuit generates third bits which indicate a respective first edge segment of the second delay line.

In an embodiment, cycle generator 1022 further comprises other delay lines which receive respective bits based on the second bits and the third bits. These other delay lines each provide a different respective bit sequence based on the second bits and third bits, wherein respective bits of these bit sequences indicate to sequencer 1024 when transitions of clock signal 1025 are to take place.

Figure 11:
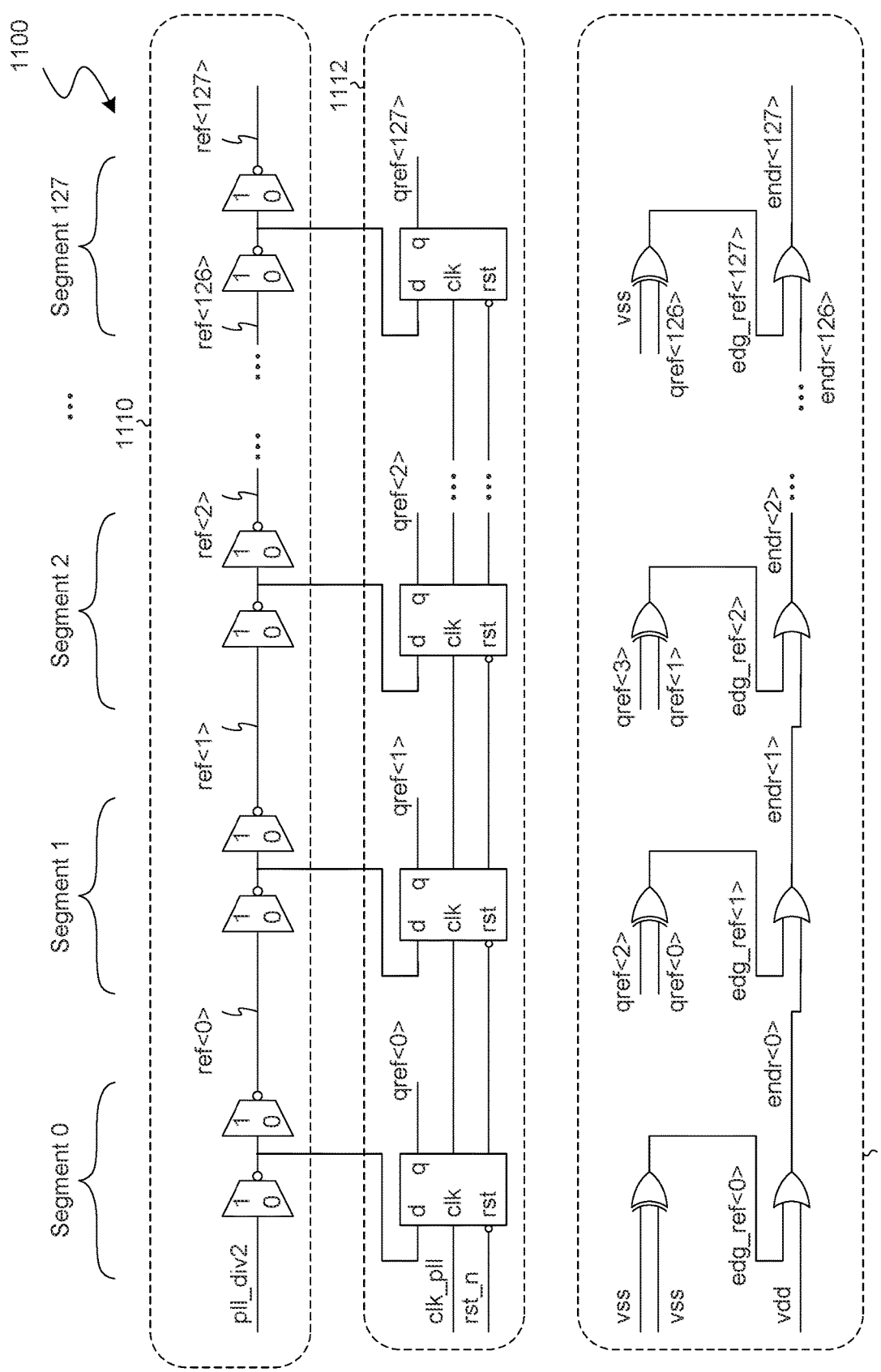
FIG. 11 shows a circuit diagram illustrating features of a reference period detector according to an embodiment.
Figure 12:
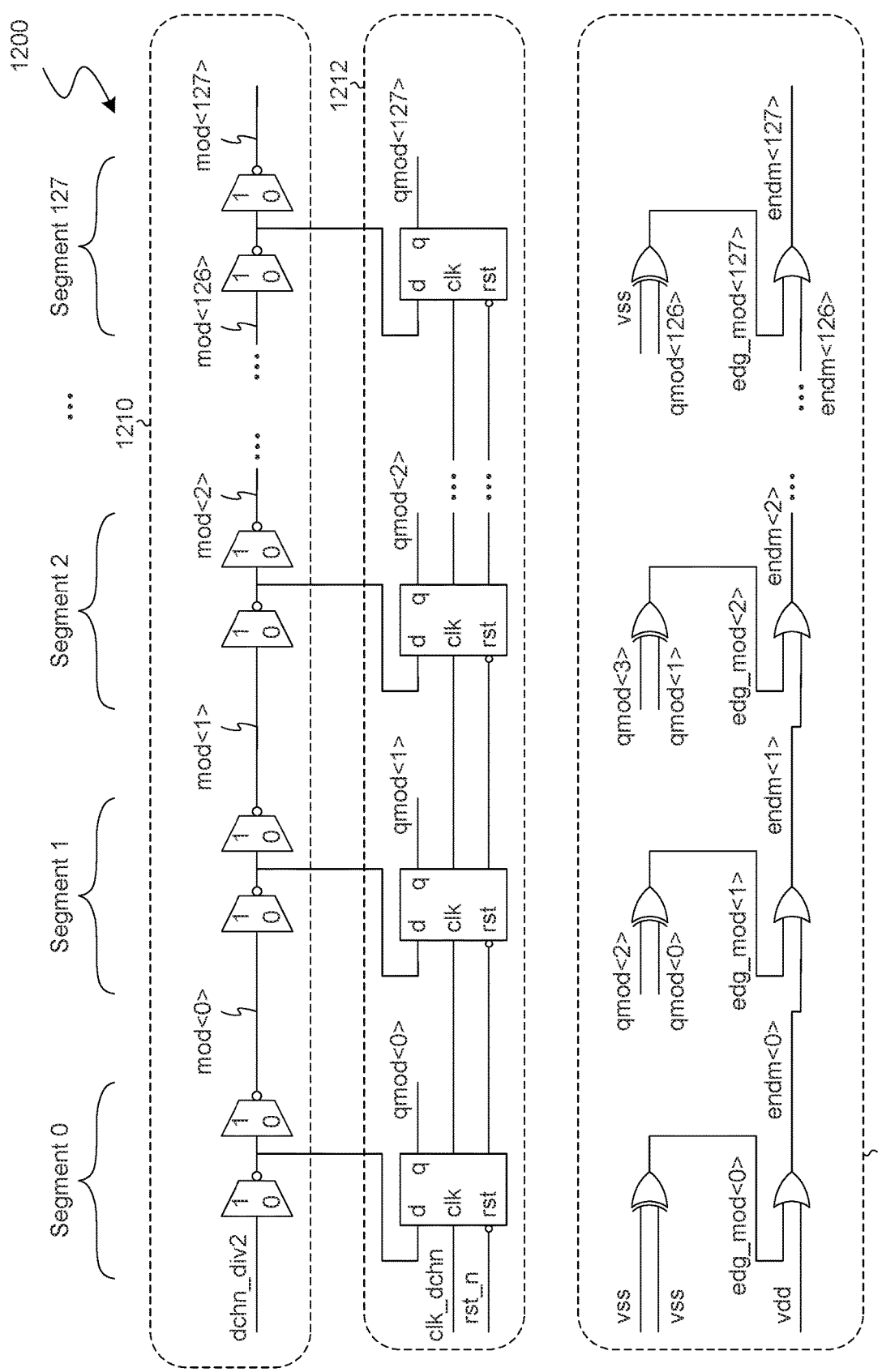
FIG. 12 shows a circuit diagram illustrating features of a modulated period detector according to an embodiment.
Figure 13:
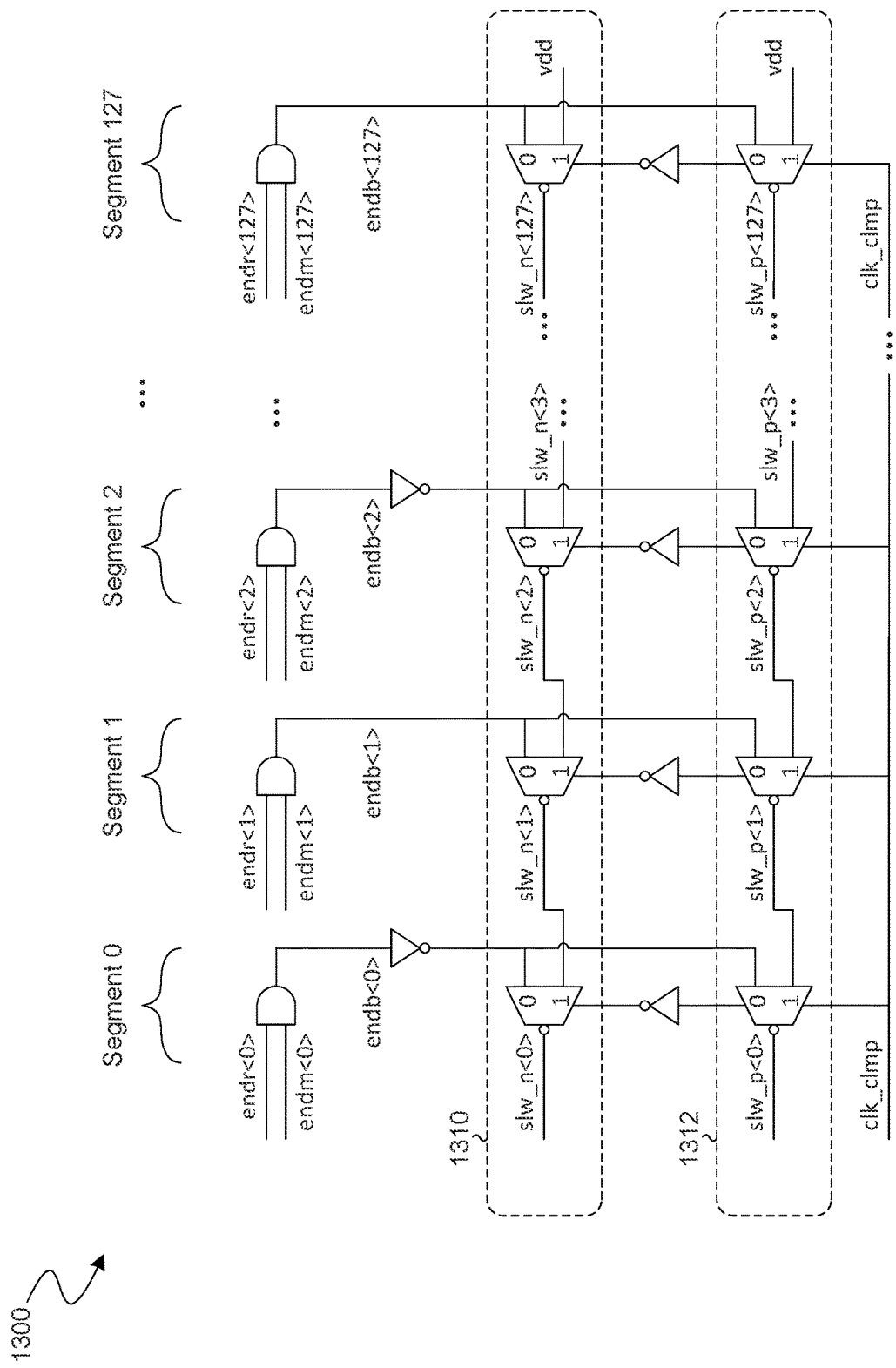
FIG. 13 shows a circuit diagram illustrating features of a clock period generator according to an embodiment.

In some embodiments—as illustrated by FIGS. 11 through 13—functionality of cycle generator 1022 is provided with a frequency detector 1100, a frequency detector 1200, and a period generator 1300—e.g., wherein sequencer 1024 provides functionality such as that of sequencer 600 (and where, for example, signal 1025, or clamped signal clk_clmp, corresponds functionally to clock signal clk_osc).

In the example embodiment shown, frequency clamp 1020 comprises a multiplexer 1026 to provide clamped clock signal clk_clmp as a selected one of signal clk_dchn or clock signal 1025. In one such embodiment, delay line circuitry 1000 further comprises a synchronous glitch-free clock multiplexer 1030 that enables a selective bypassing of delay chain 1010 and frequency clamp 1020—e.g., during a reconfiguration of a device comprising delay line circuitry 1000. Such bypassing takes place, for example, where respective settings of delay chain 1010 and frequency clamp 1020 need to be changed when (for example) an operating voltage changes. The bypassing mitigates the possibility of a glitch in signal clk_clmp being passed, as a corresponding glitch in signal clk_dline, to the load circuitry.

FIG. 11 shows features of a frequency detector 1100 to detect the period (and a corresponding frequency) of a PLL output signal which facilitates ACM functionality according to an embodiment. In various embodiments, frequency detector 1100 provides at least some functionality of cycle generator 1022—e.g., wherein frequency detector 1100 implements features of delay line 120 and sample/load circuitry 130, for example.

As shown in FIG. 11, frequency detector 1100 comprises a delay line 1110 which is coupled to receive a periodic signal pll_div2, and sampler circuit 1112 which is coupled to sample multiple bits each from a different respective segment of delay line 1110. In one such embodiment, signal pll_div2 is a frequency divided version of the periodic signal clk_pll that is provided to frequency clamp 1020.

Delay line 1110 comprises an in-series arrangement of 128 segments which (for example) each comprise a respective pair of two-to-one multiplexer circuits. In an illustrative scenario according to one embodiment, an edge of the signal pll_div2 (e.g., a low-to-high rising edge) is launched down delay line 1110. After a next subsequent single cycle of signal pll_div2, qref flip-flops of sampler circuit 1112 sample bits ref<127:0> which indicate how far an indication of this most recent rising edge of signal pll_div2 has propagated in delay line 1110. Based on the sampling of delay line 1110, the qref flip-flops of sampler circuit 1112 output 128 bits qref<127:0> which are based on signal pll_div2.

Frequency detector 1100 further comprises an edge detection circuit 1114 to generate, based on qref<127:0>, information which identifies a first edge segment of delay line 1110. By way of illustration and not limitation, XOR gates of edge detection circuit 1114 generate bits edg_ref<127:0> which each indicate, for a corresponding delay line segment of delay line 1110, whether adjoining segments have different respective bit values. Subsequently, bits endr<127:0> of an "end of reference" thermometer code are generated, based on bits edg_ref<127:0>, to indicate the current first edge segment of delay line 1110.

FIG. 12 shows features of a frequency detector 1200 to detect the period (and a corresponding frequency) of a delay chain output signal, to facilitate ACM functionality according to an embodiment. In various embodiments, frequency detector 1200 provides at least some functionality of cycle generator 1022—e.g., wherein frequency detector 1200 operates in combination with frequency detector 1100.

As shown in FIG. 12, frequency detector 1200 comprises a delay line 1210 which is coupled to receive a periodic signal dchn_div2, and sampler circuit 1212 which is coupled to sample multiple bits each from a different respective segment of delay line 1210. In one such embodiment, signal dchn_div2 is a frequency divided version of the periodic signal clk_dchn that is provided to frequency clamp 1020 by delay chain 1010.

Similar to delay line 1110, delay line 1210 comprises an in-series arrangement of 128 segments which (for example) each comprise a respective pair of two-to-one multiplexer circuits. Based on a sampling of delay line 1210, the qmod flip-flops of sampler circuit 1212 output 128 bits qmod<127:0> which are based on signal dchn_div2.

Frequency detector 1200 further comprises an edge detection circuit 1214 to generate, based on qmod<127:0>, information which identifies a first edge segment of delay line 1210. By way of illustration and not limitation, XOR gates of edge detection circuit 1214 generate bits edg_mod<127:0> which each indicate, for a corresponding delay line segment of delay line 1210, whether adjoining segments have different respective bit values. Subsequently, bits endm<127:0> of an "end of modulated" thermometer code are generated, based on bits edg_mod<127:0>, to indicate the current first edge segment of delay line 1210.

FIG. 13 shows features of a period generator 1300 which generates two sequences of bits, with respective delay lines, to facilitate ACM functionality according to an embodiment. In various embodiments, period generator 1300 operates with frequency detectors 1100, 1200—e.g., wherein period generator 1300 provides at least some functionality of cycle generator 1022.

As shown in FIG. 13, first AND gates of period generator 1300 each receive a respective one of bits endr<127:0> and a respective one of bits endm<127:0> from frequency detector 1100 and frequency detector 1200 (respectively). The first AND gates output bits endb<127:0> which, for example, indicate a longer one of the respective periods indicated by endr<127:0> and endm<127:0>.

Period generator 1300 further comprises two delay lines 1310, 1312 which, unlike delay line 1110, each comprise only a respective single multiplexer per segment. Thus, if it takes one period of a clock signal clk_clmp for a signal edge to travel from segment 0 to some segment n in delay line 1110, it only takes half a clock period for a corresponding signal edge to travel from segment n to segment 0 in one of delay lines 1310, 1312.

Delay lines 1310, 1312 are coupled to variously receive "odd" bits of endb<127:0>, and inverted versions of the "even" bits of endb<127:0>. For example, delay lines 1310, 1312 are loaded with bits during different respective half-cycles of the clock signal clk_clmp. Similarly, slw_p bits propagate along delay line 1312, and slw_n bits propagate along delay line 1310, during different respective half-cycles of the clock signal clk_clmp. In one such embodiment, when clock signal clk_clmp is low, slw_p bits propagate along delay line 1312, eventually causing an output bit slw_p<0> to go high. This output bit slw_p<0> is provided, for example, to a first flip-flop of a sequencer (not shown) which controls the transitioning of clk_clmp—e.g., wherein the first flip-flop corresponds functionally to flip-flop 610 of sequencer 600. By contrast, when clock signal clk_clmp is high, slw_n bits propagate along delay line 1310, eventually causing another output bit slw_n<0> to go high. This output bit slw_n<0> is provided, for example, to a second flip-flop of the sequencer—e.g., wherein the second flip-flop corresponds functionally to flip-flop 612 of sequencer 600.

Figure 14:
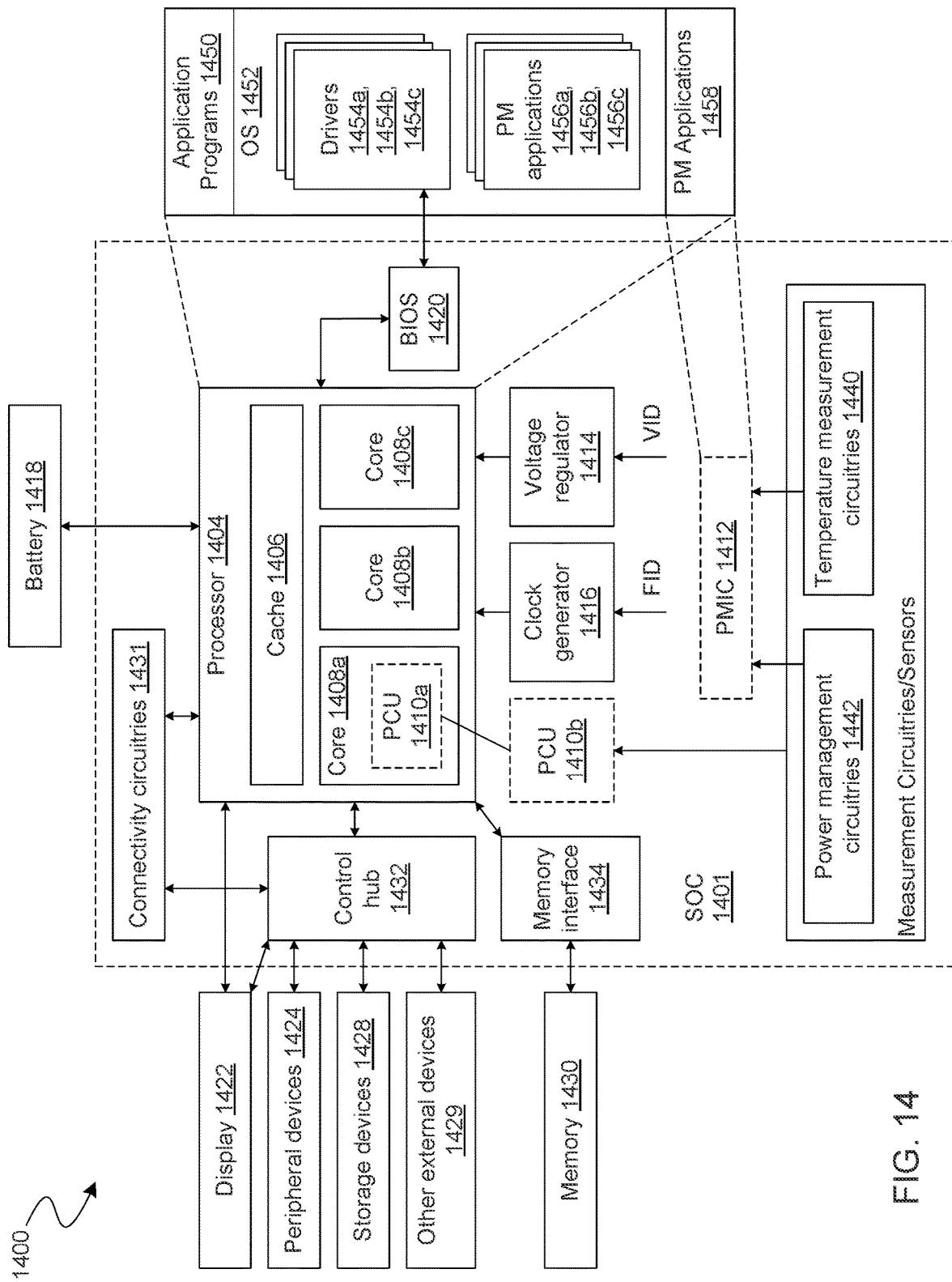
FIG. 14 is a functional block diagram illustrating a computing device in accordance with one embodiment.

FIG. 14 illustrates a computer system or computing device 1400 (also referred to as device 1400), where the frequency of a clock signal is determined using multiple delay circuits, in accordance with some embodiments. It is pointed out that those elements of FIG. 14 having the same reference numbers (or names) as the elements of any other figure can operate or function in any manner similar to that described, but are not limited to such.

In some embodiments, device 1400 represents an appropriate computing device, such as a computing tablet, a mobile phone or smart-phone, a laptop, a desktop, an Internet-of-Things (JOT) device, a server, a wearable device, a set-top box, a wireless-enabled e-reader, or the like. It will be understood that certain components are shown generally, and not all components of such a device are shown in device 1400.

In an example, the device 1400 comprises a SoC (System-on-Chip) 1401. An example boundary of the SOC 1401 is illustrated using dotted lines in FIG. 14, with some example components being illustrated to be included within SOC 1401—however, SOC 1401 may include any appropriate components of device 1400.

In some embodiments, device 1400 includes processor 1404. Processor 1404 can include one or more physical devices, such as microprocessors, application processors, microcontrollers, programmable logic devices, processing cores, or other processing means. The processing operations performed by processor 1404 include the execution of an operating platform or operating system on which applications and/or device functions are executed. The processing operations include operations related to I/O (input/output) with a human user or with other devices, operations related to power management, operations related to connecting computing device 1400 to another device, and/or the like. The processing operations may also include operations related to audio I/O and/or display I/O.

In some embodiments, processor 1404 includes multiple processing cores (also referred to as cores) 1408a, 1408b, 1408c. Although merely three cores 1408a, 1408b, 1408c are illustrated in FIG. 14, the processor 1404 may include any other appropriate number of processing cores, e.g., tens, or even hundreds of processing cores. Processor cores 1408*a*, 1408*b*, 1408*c* may be implemented on a single integrated circuit (IC) chip. Moreover, the chip may include one or more shared and/or private caches, buses or interconnections, graphics and/or memory controllers, or other components.

In some embodiments, processor 1404 includes cache 1406. In an example, sections of cache 1406 may be dedicated to individual cores 1408 (e.g., a first section of cache 1406 dedicated to core 1408*a*, a second section of cache 1406 dedicated to core 1408*b*, and so on). In an example, one or more sections of cache 1406 may be shared among two or more of cores 1408. Cache 1406 may be split in different levels, e.g., level 1 (L1) cache, level 2 (L2) cache, level 3 (L3) cache, etc.

In some embodiments, a given processor core (e.g., core 1408*a*) may include a fetch unit to fetch instructions (including instructions with conditional branches) for execution by the core 1408*a*. The instructions may be fetched from any storage devices such as the memory 1430. Processor core 1408*a* may also include a decode unit to decode the fetched instruction. For example, the decode unit may decode the fetched instruction into a plurality of micro-operations. Processor core 1408*a* may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 1408*a* (for example) may be an out-of-order processor core in one embodiment. Processor core 1408*a* may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 1408*a* may also include a bus unit to enable communication between components of the processor core 1408*a* and other components via one or more buses. Processor core 1408*a* may also include one or more registers to store data accessed by various components of the core 1408*a* (such as values related to assigned app priorities and/or sub-system states (modes) association.

In some embodiments, device 1400 comprises connectivity circuitries 1431. For example, connectivity circuitries 1431 includes hardware devices (e.g., wireless and/or wired connectors and communication hardware) and/or software components (e.g., drivers, protocol stacks), e.g., to enable device 1400 to communicate with external devices. Device 1400 may be separate from the external devices, such as other computing devices, wireless access points or base stations, etc.

In an example, connectivity circuitries 1431 may include multiple different types of connectivity. To generalize, the connectivity circuitries 1431 may include cellular connectivity circuitries, wireless connectivity circuitries, etc. Cellular connectivity circuitries of connectivity circuitries 1431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 1431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 1431 may include a network interface, such as a wired or wireless interface, e.g., so that a system embodiment may be incorporated into a wireless device, for example, cell phone or personal digital assistant.

In some embodiments, device 1400 comprises control hub 1432, which represents hardware devices and/or software components related to interaction with one or more I/O devices. For example, processor 1404 may communicate with one or more of display 1422, one or more peripheral devices 1424, storage devices 1428, one or more other external devices 1429, etc., via control hub 1432. Control hub 1432 may be a chipset, a Platform Control Hub (PCH), and/or the like.

For example, control hub 1432 illustrates one or more connection points for additional devices that connect to device 1400, e.g., through which a user might interact with the system. For example, devices (e.g., devices 1429) that can be attached to device 1400 include microphone devices, speaker or stereo systems, audio devices, video systems or other display devices, keyboard or keypad devices, or other I/O devices for use with specific applications such as card readers or other devices.

As mentioned above, control hub 1432 can interact with audio devices, display 1422, etc. For example, input through a microphone or other audio device can provide input or commands for one or more applications or functions of device 1400. Additionally, audio output can be provided instead of, or in addition to display output. In another example, if display 1422 includes a touch screen, display 1422 also acts as an input device, which can be at least partially managed by control hub 1432. There can also be additional buttons or switches on computing device 1400 to provide I/O functions managed by control hub 1432. In one embodiment, control hub 1432 manages devices such as accelerometers, cameras, light sensors or other environmental sensors, or other hardware that can be included in device 1400. The input can be part of direct user interaction, as well as providing environmental input to the system to influence its operations (such as filtering for noise, adjusting displays for brightness detection, applying a flash for a camera, or other features).

In some embodiments, control hub 1432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 1422 represents hardware (e.g., display devices) and software (e.g., drivers) components that provide a visual and/or tactile display for a user to interact with device 1400. Display 1422 may include a display interface, a display screen, and/or hardware device used to provide a display to a user. In some embodiments, display 1422 includes a touch screen (or touch pad) device that provides both output and input to a user. In an example, display 1422 may communicate directly with the processor 1404. Display 1422 can be one or more of an internal display device, as in a mobile electronic device or a laptop device or an external display device attached via a display interface (e.g., DisplayPort, etc.). In one embodiment display 1422 can be a head mounted display (HMD) such as a stereoscopic display device for use in virtual reality (VR) applications or augmented reality (AR) applications.

In some embodiments and although not illustrated in the figure, in addition to (or instead of) processor 1404, device 1400 may include Graphics Processing Unit (GPU) comprising one or more graphics processing cores, which may control one or more aspects of displaying contents on display 1422.

Control hub 1432 (or platform controller hub) may include hardware interfaces and connectors, as well as software components (e.g., drivers, protocol stacks) to make peripheral connections, e.g., to peripheral devices 1424.

It will be understood that device 1400 could both be a peripheral device to other computing devices, as well as have peripheral devices connected to it. Device 1400 may have a "docking" connector to connect to other computing devices for purposes such as managing (e.g., downloading and/or uploading, changing, synchronizing) content on device 1400. Additionally, a docking connector can allow device 1400 to connect to certain peripherals that allow computing device 1400 to control content output, for example, to audiovisual or other systems.

In addition to a proprietary docking connector or other proprietary connection hardware, device 1400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 1431 may be coupled to control hub 1432, e.g., in addition to, or instead of, being coupled directly to the processor 1404. In some embodiments, display 1422 may be coupled to control hub 1432, e.g., in addition to, or instead of, being coupled directly to processor 1404.

In some embodiments, device 1400 comprises memory 1430 coupled to processor 1404 via memory interface 1434. Memory 1430 includes memory devices for storing information in device 1400. Memory can include nonvolatile (state does not change if power to the memory device is interrupted) and/or volatile (state is indeterminate if power to the memory device is interrupted) memory devices. Memory device 1430 can be a dynamic random access memory (DRAM) device, a static random access memory (SRAM) device, flash memory device, phase-change memory device, or some other memory device having suitable performance to serve as process memory. In one embodiment, memory 1430 can operate as system memory for device 1400, to store data and instructions for use when the one or more processors 1404 executes an application or process. Memory 1430 can store application data, user data, music, photos, documents, or other data, as well as system data (whether long-term or temporary) related to the execution of the applications and functions of device 1400.

Elements of various embodiments and examples are also provided as a machine-readable medium (e.g., memory 1430) for storing the computer-executable instructions (e.g., instructions to implement any other processes discussed herein). The machine-readable medium (e.g., memory 1430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 1400 comprises temperature measurement circuitries 1440, e.g., for measuring temperature of various components of device 1400. In an example, temperature measurement circuitries 1440 may be embedded, or coupled or attached to various components, whose temperature are to be measured and monitored. For example, temperature measurement circuitries 1440 may measure temperature of (or within) one or more of cores 1408*a*, 1408*b*, 1408*c*, voltage regulator 1414, memory 1430, a mother-board of SOC 1401, and/or any appropriate component of device 1400.

In some embodiments, device 1400 comprises power measurement circuitries 1442, e.g., for measuring power consumed by one or more components of the device 1400. In an example, in addition to, or instead of, measuring power, the power measurement circuitries 1442 may measure voltage and/or current. In an example, the power measurement circuitries 1442 may be embedded, or coupled or attached to various components, whose power, voltage, and/or current consumption are to be measured and monitored. For example, power measurement circuitries 1442 may measure power, current and/or voltage supplied by one or more voltage regulators 1414, power supplied to SOC 1401, power supplied to device 1400, power consumed by processor 1404 (or any other component) of device 1400, etc.

In some embodiments, device 1400 comprises one or more voltage regulator circuitries, generally referred to as voltage regulator (VR) 1414. VR 1414 generates signals at appropriate voltage levels, which may be supplied to operate any appropriate components of the device 1400. Merely as an example, VR 1414 is illustrated to be supplying signals to processor 1404 of device 1400. In some embodiments, VR 1414 receives one or more Voltage Identification (VID) signals, and generates the voltage signal at an appropriate level, based on the VID signals. Various type of VRs may be utilized for the VR 1414. For example, VR 1414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 1410*a/b* and/or PMIC 1412. In some embodiments, each core has a network of distributed LDOs to provide efficient control for power management. The LDOs can be digital, analog, or a combination of digital or analog LDOs.

In some embodiments, device 1400 comprises one or more clock generator circuitries, generally referred to as clock generator 1416. Clock generator 1416 generates clock signals at appropriate frequency levels, which may be supplied to any appropriate components of device 1400. Merely as an example, clock generator 1416 is illustrated to be supplying clock signals to processor 1404 of device 1400. In some embodiments, clock generator 1416 receives one or more Frequency Identification (FID) signals, and generates the clock signals at an appropriate frequency, based on the FID signals.

In some embodiments, device 1400 comprises battery 1418 supplying power to various components of device 1400. Merely as an example, battery 1418 is illustrated to be supplying power to processor 1404. Although not illustrated in the figures, device 1400 may comprise a charging circuitry, e.g., to recharge the battery, based on Alternating Current (AC) power supply received from an AC adapter.

In some embodiments, device 1400 comprises Power Control Unit (PCU) 1410 (also referred to as Power Management Unit (PMU), Power Controller, etc.). In an example, some sections of PCU 1410 may be implemented by one or more processing cores 1408, and these sections of PCU 1410 are symbolically illustrated using a dotted box and labelled PCU 1410*a*. In an example, some other sections of PCU 1410 may be implemented outside the processing cores 1408, and these sections of PCU 1410 are symbolically illustrated using a dotted box and labelled as PCU 1410*b*. PCU 1410 may implement various power management operations for device 1400. PCU 1410 may include hardware interfaces, hardware circuitries, connectors, registers, etc., as well as software components (e.g., drivers, protocol stacks), to implement various power management operations for device 1400.

In some embodiments, device 1400 comprises Power Management Integrated Circuit (PMIC) 1412, e.g., to implement various power management operations for device 1400. In some embodiments, PMIC 1412 is a Reconfigurable Power Management ICs (RPMICs) and/or an IMVP (Intel® Mobile Voltage Positioning). In an example, the PMIC is within an IC chip separate from processor 1404. The may implement various power management operations for device 1400. PMIC 1412 may include hardware interfaces, hardware circuitries, connectors, registers, etc., as well as software components (e.g., drivers, protocol stacks), to implement various power management operations for device 1400.

In an example, device 1400 comprises one or both PCU 1410 or PMIC 1412. In an example, any one of PCU 1410 or PMIC 1412 may be absent in device 1400, and hence, these components are illustrated using dotted lines.

Various power management operations of device 1400 may be performed by PCU 1410, by PMIC 1412, or by a combination of PCU 1410 and PMIC 1412. For example, PCU 1410 and/or PMIC 1412 may select a power state (e.g., P-state) for various components of device 1400. For example, PCU 1410 and/or PMIC 1412 may select a power state (e.g., in accordance with the ACPI (Advanced Configuration and Power Interface) specification) for various components of device 1400. Merely as an example, PCU 1410 and/or PMIC 1412 may cause various components of the device 1400 to transition to a sleep state, to an active state, to an appropriate C state (e.g., C0 state, or another appropriate C state, in accordance with the ACPI specification), etc. In an example, PCU 1410 and/or PMIC 1412 may control a voltage output by VR 1414 and/or a frequency of a clock signal output by the clock generator, e.g., by outputting the VID signal and/or the FID signal, respectively. In an example, PCU 1410 and/or PMIC 1412 may control battery power usage, charging of battery 1418, and features related to power saving operation.

The clock generator 1416 can comprise a phase locked loop (PLL), frequency locked loop (FLL), or any suitable clock source. In some embodiments, each core of processor 1404 has its own clock source. As such, each core can operate at a frequency independent of the frequency of operation of the other core. In some embodiments, PCU 1410 and/or PMIC 1412 performs adaptive or dynamic frequency scaling or adjustment. For example, clock frequency of a processor core can be increased if the core is not operating at its maximum power consumption threshold or limit. In some embodiments, PCU 1410 and/or PMIC 1412 determines the operating condition of each core of a processor, and opportunistically adjusts frequency and/or power supply voltage of that core without the core clocking source (e.g., PLL of that core) losing lock when the PCU 1410 and/or PMIC 1412 determines that the core is operating below a target performance level. For example, if a core is drawing current from a power supply rail less than a total current allocated for that core or processor 1404, then PCU 1410 and/or PMIC 1412 can temporarily increase the power draw for that core or processor 1404 (e.g., by increasing clock frequency and/or power supply voltage level) so that the core or processor 1404 can perform at a higher performance level. As such, voltage and/or frequency can be increased temporality for processor 1404 without violating product reliability.

In an example, PCU 1410 and/or PMIC 1412 may perform power management operations, e.g., based at least in part on receiving measurements from power measurement circuitries 1442, temperature measurement circuitries 1440, charge level of battery 1418, and/or any other appropriate information that may be used for power management. To that end, PMIC 1412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 1410 and/or PMIC 1412 in at least one embodiment to allow PCU 1410 and/or PMIC 1412 to manage processor core energy at least in part based on value(s) detected by one or more of the sensors.

Also illustrated is an example software stack of device 1400 (although not all elements of the software stack are illustrated). Merely as an example, processors 1404 may execute application programs 1450, Operating System 1452, one or more Power Management (PM) specific application programs (e.g., generically referred to as PM applications 1458), and/or the like. PM applications 1458 may also be executed by the PCU 1410 and/or PMIC 1412. OS 1452 may also include one or more PM applications 1456*a*, 1456*b*, 1456*c*. The OS 1452 may also include various drivers

1454*a*, 1454*b*, 1454*c*, etc., some of which may be specific for power management purposes. In some embodiments, device 1400 may further comprise a Basic Input/Output System (BIOS) 1420. BIOS 1420 may communicate with OS 1452 (e.g., via one or more drivers 1454), communicate with processors 1404, etc.

For example, one or more of PM applications 1458, 1456, drivers 1454, BIOS 1420, etc. may be used to implement power management specific tasks, e.g., to control voltage and/or frequency of various components of device 1400, to control wake-up state, sleep state, and/or any other appropriate power state of various components of device 1400, control battery power usage, charging of the battery 1418, features related to power saving operation, etc. In various embodiments, adaptive clock modulation functionality such as that described herein is provided, for example, with one or more of PCU 1410*a*, PCU 1410*b*, PMIC 1412, clock generator 1416, or power measurement circuitries 1442 (for example).

In one or more first embodiments, an integrated circuit (IC) comprises a first delay line to receive a first signal, the first delay line comprising first segments each to provide a different respective one of first bits which are each based on the first signal, sampler circuitry coupled to sample the first bits, load circuitry coupled to receive the first bits from the sampler circuitry, the load circuitry to generate, based on the first bits, a thermometer code value comprising second bits and third bits, a second delay line comprising second segments which are coupled each to receive a different respective bit of the second bits, wherein the second delay line is to output the second bits in a first sequence, a third delay line comprising third segments which are coupled each to receive a different respective bit of the third bits, wherein the third delay line is to output the third bits in a second sequence, and sequencer circuitry coupled to receive two bits each from a different respective one of the first sequence or the second sequence, wherein the sequencer circuitry is to generate a periodic signal based on each of the two bits.

In one or more second embodiments, further to the first embodiment, the IC further comprises first circuitry coupled to the load circuitry, the first circuitry to detect a condition wherein a frequency of the first signal has been stable throughout a threshold period of time after a decrease of the frequency of the first signal to a level which is above a threshold minimum frequency level, and indicate to the load circuitry, based on the condition, that a frequency of the periodic signal is to be equal to the frequency of the first signal.

In one or more third embodiments, further to the first embodiment or the second embodiment, the IC further comprises first circuitry coupled to the load circuitry, the first circuitry to detect a condition wherein, after a decrease of the frequency of the first signal to a most recent local minimum frequency level, the frequency of the first signal has increased, by at least a threshold minimum frequency difference, from the most recent local minimum frequency level to a level which is above a threshold minimum frequency level, and indicate to the load circuitry, based on the condition, that a frequency of the periodic signal is to be equal to the frequency of the first signal.

In one or more fourth embodiments, further to any of the first through third embodiments, the first delay line comprises a first plurality of delay elements coupled in series with each other, the first plurality of delay elements each corresponding to a different respective one of the first segments, the second delay line comprises a second plurality of delay elements coupled in series with each other, the second plurality of delay elements each corresponding to a different respective one of the second segments, the third delay line comprises a third plurality of delay elements coupled in series with each other, the third plurality of delay elements each corresponding to a different respective one of the third segments, and a first total number of the first plurality of delay elements is greater than a second total number of the second plurality of delay elements, and is greater than a third total number of the third plurality of delay elements.

In one or more fifth embodiments, further to the fourth embodiment, the first total number is equal to twice the second total number, and is equal to twice the third total number.

In one or more sixth embodiments, further to the fourth embodiment, the second bits are interleaved with the third bits in the thermometer code value, the second plurality of delay elements are to load the second bits during a first half-cycle of the periodic signal, and the third plurality of delay elements are to load the third bits during a second half-cycle of the periodic signal, wherein the second cycle is a next half-cycle of the periodic signal after the first half-cycle.

In one or more seventh embodiments, further to any of the first through third embodiments, the sequencer comprises a first flip flop to receive a bit of the first sequence, a second flip flop which is cross-coupled with the first flip flop, the second flip flop to receive a bit of the second sequence, and an exclusive OR (XOR) gate coupled to respective output terminals of the first flip flop and the second flip flop, wherein the XOR gate is to provide the periodic signal.

In one or more eighth embodiments, further to any of the first through third embodiments, the sample circuitry is first sampler circuitry, wherein the IC further comprises a fourth delay line to receive a second signal, the fourth delay line comprising fourth segments each to provide a different respective one of fourth bits which are each based on the second signal, and second sampler circuitry coupled to sample the fourth bits, wherein the load circuitry is further coupled to receive the fourth bits from the second sampler circuitry, and wherein the load circuitry is to generate the thermometer code value further based on the fourth bits.

In one or more ninth embodiments, further to the eighth embodiment, the IC further comprises a phase locked loop circuit to generate the first signal, a delay chain circuit coupled to receive the first signal from the phase locked loop circuit, the delay chain circuit to generate the second signal based on the first signal.

In one or more tenth embodiments, further to any of the first through third embodiments, the sequencer comprises a first flip flop to receive a bit of the first sequence, a second flip flop which is cross-coupled with the first flip flop, the second flip flop to receive a bit of the second sequence, and an exclusive OR (XOR) gate coupled to receive respective output terminals of the first flip flop and the second flip flop, wherein the XOR gate is to provide the periodic signal.

In one or more eleventh embodiments, an integrated circuit (IC) comprises a first delay line to receive a first signal, the first delay line comprising first segments each to provide a different respective one of first bits which are each based on the first signal, first circuitry coupled to sample the first bits and to generate, based on the first bits, a thermometer code value comprising second bits and third bits, a second delay line coupled to receive the second bits, and to output the second bits in a first sequence, a third delay line coupled to receive the third bits, and to output the third bits in a second sequence, sequencer circuitry to generate a periodic signal based on respective bits of the first sequence and the second sequence, and second circuitry coupled to communicate to the first circuitry an indication as to whether a frequency of the periodic signal is to be equal to a frequency of the first signal, wherein the second circuitry is to generate the indication based on each of a threshold minimum period of time during which the frequency of the first signal is stable, a threshold minimum frequency of the first signal, and a threshold minimum increase to the frequency of the first signal.

In one or more twelfth embodiments, further to the eleventh embodiment, the second circuitry is to detect a condition wherein the frequency of the first signal has been stable throughout a threshold period of time after a decrease of the frequency of the first signal to a level which is above a threshold minimum frequency level, and indicate to the first circuitry, based on the condition, that the frequency of the periodic signal is to be equal to the frequency of the first signal.

In one or more thirteenth embodiments, further to the eleventh embodiment or the twelfth embodiment, the second circuitry is to detect a condition wherein, after a decrease of the frequency of the first signal to a most recent local minimum frequency level, the frequency of the first signal has increased, by at least a threshold minimum frequency difference, from the most recent local minimum frequency level to a level which is above a threshold minimum frequency level, and indicate to the first circuitry, based on the condition, that the frequency of the periodic signal is to be equal to the frequency of the first signal.

In one or more fourteenth embodiments, further to any of the eleventh through thirteenth embodiments, the first delay line comprises a first plurality of delay elements coupled in series with each other, the first plurality of delay elements each corresponding to a different respective one of the first segments, the second delay line comprises a second plurality of delay elements coupled in series with each other, the second plurality of delay elements each corresponding to a different respective one of the second segments, the third delay line comprises a third plurality of delay elements coupled in series with each other, the third plurality of delay elements each corresponding to a different respective one of the third segments, and a first total number of the first plurality of delay elements is greater than a second total number of the second plurality of delay elements, and is greater than a third total number of the third plurality of delay elements.

In one or more fifteenth embodiments, further to the fourteenth embodiment, the first total number is equal to twice the second total number, and is equal to twice the third total number.

In one or more sixteenth embodiments, further to the fourteenth embodiment, the second bits are interleaved with the third bits in the thermometer code value, the second plurality of delay elements are to load the second bits during a first half-cycle of the periodic signal, and the third plurality of delay elements are to load the third bits during a second half-cycle of the periodic signal, wherein the second cycle is a next half-cycle of the periodic signal after the first half-cycle.

In one or more seventeenth embodiments, further to any of the eleventh through thirteenth embodiments, the sequencer comprises a first flip flop to receive a bit of the first sequence, a second flip flop which is cross-coupled with the first flip flop, the second flip flop to receive a bit of the second sequence, and an exclusive OR (XOR) gate coupled to receive respective output terminals of the first flip flop and the second flip flop, wherein the XOR gate is to provide the periodic signal.

In one or more eighteenth embodiments, a system comprises an integrated circuit (IC) comprising a first delay line to receive a first signal, the first delay line comprising first segments each to provide a different respective one of first bits which are each based on the first signal, sampler circuitry coupled to sample the first bits, load circuitry coupled to receive the first bits from the sampler circuitry, the load circuitry to generate, based on the first bits, a thermometer code value comprising second bits and third bits, a second delay line comprising second segments which are coupled each to receive a different respective bit of the second bits, wherein the second delay line is to output the second bits in a first sequence, a third delay line comprising third segments which are coupled each to receive a different respective bit of the third bits, wherein the third delay line is to output the third bits in a second sequence, and sequencer circuitry coupled to receive two bits each from a different respective one of the first sequence or the second sequence, wherein the sequencer circuitry is to generate a periodic signal based on each of the two bits, and a display device coupled to the IC, the display device to display an image based on the periodic signal.

In one or more nineteenth embodiments, further to the eighteenth embodiment, the IC further comprises first circuitry coupled to the load circuitry, the first circuitry to detect a condition wherein a frequency of the first signal has been stable throughout a threshold period of time after a decrease of the frequency of the first signal to a level which is above a threshold minimum frequency level, and indicate to the load circuitry, based on the condition, that a frequency of the periodic signal is to be equal to the frequency of the first signal.

In one or more twentieth embodiments, further to the eighteenth embodiment or the nineteenth embodiment, the IC further comprises first circuitry coupled to the load circuitry, the first circuitry to detect a condition wherein, after a decrease of the frequency of the first signal to a most recent local minimum frequency level, the frequency of the first signal has increased, by at least a threshold minimum frequency difference, from the most recent local minimum frequency level to a level which is above a threshold minimum frequency level, and indicate to the load circuitry, based on the condition, that a frequency of the periodic signal is to be equal to the frequency of the first signal.

In one or more twenty-first embodiments, further to any of the eighteenth through twentieth embodiments, the first delay line comprises a first plurality of delay elements coupled in series with each other, the first plurality of delay elements each corresponding to a different respective one of the first segments, the second delay line comprises a second plurality of delay elements coupled in series with each other, the second plurality of delay elements each corresponding to a different respective one of the second segments, the third delay line comprises a third plurality of delay elements coupled in series with each other, the third plurality of delay elements each corresponding to a different respective one of the third segments, and a first total number of the first plurality of delay elements is greater than a second total number of the second plurality of delay elements, and is greater than a third total number of the third plurality of delay elements.

In one or more twenty-second embodiments, further to the twenty-first embodiment, the first total number is equal to twice the second total number, and is equal to twice the third total number.

In one or more twenty-third embodiments, further to the twenty-first embodiment, the second bits are interleaved with the third bits in the thermometer code value, the second plurality of delay elements are to load the second bits during a first half-cycle of the periodic signal, and the third plurality of delay elements are to load the third bits during a second half-cycle of the periodic signal, wherein the second cycle is a next half-cycle of the periodic signal after the first half-cycle.

In one or more twenty-fourth embodiments, further to any of the eighteenth through twentieth embodiments, the sequencer comprises a first flip flop to receive a bit of the first sequence, a second flip flop which is cross-coupled with the first flip flop, the second flip flop to receive a bit of the second sequence, and an exclusive OR (XOR) gate coupled to receive respective output terminals of the first flip flop and the second flip flop, wherein the XOR gate is to provide the periodic signal.

In one or more twenty-fifth embodiments, further to any of the eighteenth through twentieth embodiments, the sample circuitry is first sampler circuitry, wherein the IC further comprises a fourth delay line to receive a second signal, the fourth delay line comprising fourth segments each to provide a different respective one of fourth bits which are each based on the second signal, and second sampler circuitry coupled to sample the fourth bits, wherein the load circuitry is further coupled to receive the fourth bits from the second sampler circuitry, and wherein the load circuitry is to generate the thermometer code value further based on the fourth bits.

In one or more twenty-sixth embodiments, further to the twenty-fifth embodiment, the IC further comprises a phase locked loop circuit to generate the first signal, a delay chain circuit coupled to receive the first signal from the phase locked loop circuit, the delay chain circuit to generate the second signal based on the first signal.

In one or more twenty-seventh embodiments, further to any of the eighteenth through twentieth embodiments, the sequencer comprises a first flip flop to receive a bit of the first sequence, a second flip flop which is cross-coupled with the first flip flop, the second flip flop to receive a bit of the second sequence, and an exclusive OR (XOR) gate coupled to receive respective output terminals of the first flip flop and the second flip flop, wherein the XOR gate is to provide the periodic signal.

Techniques and architectures for determining a frequency of a clock signal are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) comprising:
   a first delay line to receive a first signal, the first delay line comprising first segments each to provide a different respective one of first bits which are each based on the first signal;

sampler circuitry coupled to sample the first bits;
load circuitry coupled to receive the first bits from the sampler circuitry, the load circuitry to generate, based on the first bits, a thermometer code value comprising second bits and third bits;
a second delay line comprising second segments which are coupled each to receive a different respective bit of the second bits, wherein the second delay line is to output the second bits in a first sequence;
a third delay line comprising third segments which are coupled each to receive a different respective bit of the third bits, wherein the third delay line is to output the third bits in a second sequence; and
sequencer circuitry coupled to receive two bits each from a different respective one of the first sequence or the second sequence, wherein the sequencer circuitry is to generate a periodic signal based on each of the two bits.

2. The IC of claim 1, further comprising first circuitry coupled to a load circuitry, the first circuitry to:
detect a condition wherein a frequency of the first signal has been stable throughout a threshold period of time after a decrease of the frequency of the first signal to a level which is above a threshold minimum frequency level; and
indicate to the load circuitry, based on the condition, that a frequency of the periodic signal is to be equal to the frequency of the first signal.

3. The IC of claim 1, further comprising first circuitry coupled to a load circuitry, the first circuitry to:
detect a condition wherein, after a decrease of the frequency of the first signal to a most recent local minimum frequency level, the frequency of the first signal has increased, by at least a threshold minimum frequency difference, from the most recent local minimum frequency level to a level which is above a threshold minimum frequency level; and
indicate to the load circuitry, based on the condition, that a frequency of the periodic signal is to be equal to the frequency of the first signal.

4. The IC of claim 1, wherein:
the first delay line comprises a first plurality of delay elements coupled in series with each other, the first plurality of delay elements each corresponding to a different respective one of the first segments;
the second delay line comprises a second plurality of delay elements coupled in series with each other, the second plurality of delay elements each corresponding to a different respective one of the second segments;
the third delay line comprises a third plurality of delay elements coupled in series with each other, the third plurality of delay elements each corresponding to a different respective one of the third segments;
a first total number of the first plurality of delay elements is greater than a second total number of the second plurality of delay elements, and is greater than a third total number of the third plurality of delay elements.

5. The IC of claim 4, wherein the first total number is equal to twice the second total number, and is equal to twice the third total number.

6. The IC of claim 4, wherein:
the second bits are interleaved with the third bits in the thermometer code value;
the second plurality of delay elements are to load the second bits during a first half-cycle of the periodic signal; and
the third plurality of delay elements are to load the third bits during a second half-cycle of the periodic signal, wherein the second cycle is a next half-cycle of the periodic signal after the first half-cycle.

7. The IC of claim 1, wherein the sequencer comprises:
a first flip flop to receive a bit of the first sequence;
a second flip flop which is cross-coupled with the first flip flop, the second flip flop to receive a bit of the second sequence; and
an exclusive OR (XOR) gate coupled to respective output terminals of the first flip flop and the second flip flop, wherein the XOR gate is to provide the periodic signal.

8. The IC of claim 1, wherein the sample circuitry is first sampler circuitry, the IC further comprising:
a fourth delay line to receive a second signal, the fourth delay line comprising fourth segments each to provide a different respective one of fourth bits which are each based on the second signal; and
second sampler circuitry coupled to sample the fourth bits;
wherein the load circuitry is further coupled to receive the fourth bits from the second sampler circuitry, and wherein the load circuitry is to generate the thermometer code value further based on the fourth bits.

9. The IC of claim 1, wherein the sequencer comprises:
a first flip flop to receive a bit of the first sequence;
a second flip flop which is cross-coupled with the first flip flop, the second flip flop to receive a bit of the second sequence; and
an exclusive OR (XOR) gate coupled to receive respective output terminals of the first flip flop and the second flip flop, wherein the XOR gate is to provide the periodic signal.

10. An integrated circuit (IC) comprising:
a first delay line to receive a first signal, the first delay line comprising first segments each to provide a different respective one of first bits which are each based on the first signal;
first circuitry coupled to sample the first bits and to generate, based on the first bits, a thermometer code value comprising second bits and third bits;
a second delay line coupled to receive the second bits, and to output the second bits in a first sequence;
a third delay line coupled to receive the third bits, and to output the third bits in a second sequence;
sequencer circuitry to generate a periodic signal based on respective bits of the first sequence and the second sequence; and
second circuitry coupled to communicate to the first circuitry an indication as to whether a frequency of the periodic signal is to be equal to a frequency of the first signal, wherein the second circuitry is to generate the indication based on each of a threshold minimum period of time during which the frequency of the first signal is stable, a threshold minimum frequency of the first signal, and a threshold minimum increase to the frequency of the first signal.

11. The IC of claim 10, wherein the second circuitry is to:
detect a condition wherein the frequency of the first signal has been stable throughout a threshold period of time after a decrease of the frequency of the first signal to a level which is above a threshold minimum frequency level; and
indicate to the first circuitry, based on the condition, that the frequency of the periodic signal is to be equal to the frequency of the first signal.

12. The IC of claim 10, wherein the second circuitry is to:
detect a condition wherein, after a decrease of the frequency of the first signal to a most recent local minimum frequency level, the frequency of the first signal has increased, by at least a threshold minimum frequency difference, from the most recent local minimum frequency level to a level which is above a threshold minimum frequency level; and indicate to the first circuitry, based on the condition, that the frequency of the periodic signal is to be equal to the frequency of the first signal.

13. The IC of claim 10, wherein:

the first delay line comprises a first plurality of delay elements coupled in series with each other, the first plurality of delay elements each corresponding to a different respective one of the first segments;

the second delay line comprises a second plurality of delay elements coupled in series with each other, the second plurality of delay elements each corresponding to a different respective one of the second segments;

the third delay line comprises a third plurality of delay elements coupled in series with each other, the third plurality of delay elements each corresponding to a different respective one of the third segments; and a first total number of the first plurality of delay elements is greater than a second total number of the second plurality of delay elements, and is greater than a third total number of the third plurality of delay elements.

14. The IC of claim 13, wherein:

the second bits are interleaved with the third bits in the thermometer code value;

the second plurality of delay elements are to load the second bits during a first half-cycle of the periodic signal; and the third plurality of delay elements are to load the third bits during a second half-cycle of the periodic signal, wherein the second cycle is a next half-cycle of the periodic signal after the first half-cycle.

15. The IC of claim 10, wherein the sequencer comprises:

a first flip flop to receive a bit of the first sequence;

a second flip flop which is cross-coupled with the first flip flop, the second flip flop to receive a bit of the second sequence; and an exclusive OR (XOR) gate coupled to receive respective output terminals of the first flip flop and the second flip flop, wherein the XOR gate is to provide the periodic signal.

16. A system comprising:

an integrated circuit (IC) comprising:

a first delay line to receive a first signal, the first delay line comprising first segments each to provide a different respective one of first bits which are each based on the first signal;

sampler circuitry coupled to sample the first bits;

load circuitry coupled to receive the first bits from the sampler circuitry, the load circuitry to generate, based on the first bits, a thermometer code value comprising second bits and third bits;

a second delay line comprising second segments which are coupled each to receive a different respective bit of the second bits, wherein the second delay line is to output the second bits in a first sequence;

a third delay line comprising third segments which are coupled each to receive a different respective bit of the third bits, wherein the third delay line is to output the third bits in a second sequence; and sequencer circuitry coupled to receive two bits each from a different respective one of the first sequence or the second sequence, wherein the sequencer circuitry is to generate a periodic signal based on each of the two bits; and a display device coupled to the IC, the display device to display an image based on the periodic signal.

17. The system of claim 16, the IC further comprising first circuitry coupled to a load circuitry, the first circuitry to:

detect a condition wherein a frequency of the first signal has been stable throughout a threshold period of time after a decrease of the frequency of the first signal to a level which is above a threshold minimum frequency level; and indicate to the load circuitry, based on the condition, that a frequency of the periodic signal is to be equal to the frequency of the first signal.

18. The system of claim 16, the IC further comprising first circuitry coupled to a load circuitry, the first circuitry to:

detect a condition wherein, after a decrease of the frequency of the first signal to a most recent local minimum frequency level, the frequency of the first signal has increased, by at least a threshold minimum frequency difference, from the most recent local minimum frequency level to a level which is above a threshold minimum frequency level; and indicate to the load circuitry, based on the condition, that a frequency of the periodic signal is to be equal to the frequency of the first signal.

19. The system of claim 16, wherein:

the first delay line comprises a first plurality of delay elements coupled in series with each other, the first plurality of delay elements each corresponding to a different respective one of the first segments;

the second delay line comprises a second plurality of delay elements coupled in series with each other, the second plurality of delay elements each corresponding to a different respective one of the second segments;

the third delay line comprises a third plurality of delay elements coupled in series with each other, the third plurality of delay elements each corresponding to a different respective one of the third segments; and a first total number of the first plurality of delay elements is greater than a second total number of the second plurality of delay elements, and is greater than a third total number of the third plurality of delay elements.

20. The system of claim 16, wherein the sample circuitry is first sampler circuitry, the IC further comprising:

a fourth delay line to receive a second signal, the fourth delay line comprising fourth segments each to provide a different respective one of fourth bits which are each based on the second signal; and second sampler circuitry coupled to sample the fourth bits;

wherein the load circuitry is further coupled to receive the fourth bits from the second sampler circuitry, and wherein the load circuitry is to generate the thermometer code value further based on the fourth bits.

* * * * *